(12) United States Patent
Aquilino et al.

(10) Patent No.: US 8,658,486 B2
(45) Date of Patent: Feb. 25, 2014

(54) FORMING FACET-LESS EPITAXY WITH A CUT MASK

(75) Inventors: Michael Vincent Aquilino, Hopewell Junction, NY (US); Byeong Yeol Kim, LaGrangeville, NY (US); Ying Li, Newburgh, NY (US); Carl John Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/478,411

(22) Filed: May 23, 2012

(65) Prior Publication Data
US 2013/0313647 A1 Nov. 28, 2013

(51) Int. Cl.
*H01L 21/00* (2006.01)
*H01L 21/84* (2006.01)
*H01L 21/336* (2006.01)
*H01L 21/8234* (2006.01)

(52) U.S. Cl.
USPC .................. 438/197; 438/158; 257/E21.414; 257/E27.111

(58) Field of Classification Search
USPC .................. 257/347, 368, E21.444, E21.453, 257/E21.434, E21.414, E27.111; 438/158, 438/183, 197, 926, 179
See application file for complete search history.

(56) References Cited

U.S. PATENT DOCUMENTS

| | | | |
|---|---|---|---|
| 5,168,089 A | 12/1992 | Feygenson et al. | |
| 5,273,621 A | 12/1993 | Feygenson et al. | |
| 5,923,969 A * | 7/1999 | Oyamatsu | 438/183 |
| 6,617,226 B1 | 9/2003 | Suguro et al. | |
| 6,989,316 B2 | 1/2006 | Suguro et al. | |
| 7,649,232 B2 * | 1/2010 | Tamura et al. | 257/383 |
| 2004/0108524 A1 * | 6/2004 | Kitazawa et al. | 257/202 |
| 2005/0035470 A1 * | 2/2005 | Ko et al. | 257/900 |
| 2005/0233540 A1 * | 10/2005 | Yoon et al. | 438/424 |
| 2006/0157797 A1 * | 7/2006 | Tateshita | 257/369 |
| 2008/0237634 A1 * | 10/2008 | Dyer et al. | 257/190 |
| 2008/0272457 A1 * | 11/2008 | Anderson et al. | 257/531 |
| 2009/0140347 A1 * | 6/2009 | Doris et al. | 257/369 |
| 2009/0170270 A1 * | 7/2009 | Chakravarthi et al. | 438/300 |
| 2009/0212362 A1 * | 8/2009 | Cheng et al. | 257/347 |
| 2009/0221134 A1 * | 9/2009 | Wang et al. | 438/481 |
| 2009/0246921 A1 * | 10/2009 | Cheng et al. | 438/221 |
| 2010/0015778 A1 * | 1/2010 | Lin et al. | 438/443 |
| 2010/0052075 A1 * | 3/2010 | Yeh et al. | 257/410 |
| 2010/0133624 A1 * | 6/2010 | Nandakumar et al. | 257/369 |
| 2010/0258869 A1 * | 10/2010 | Morita et al. | 257/347 |

(Continued)

OTHER PUBLICATIONS

Blosse et al. "A Novel Low Cost 65nm CMOS Process Architecture With Self Aligned Isolation and W Cladded Source/Drain", Cypress Semiconductor, San Jose, CA, 2004 IEEE, pp. 28.5.1-28.5.4.

*Primary Examiner* — David S Blum
(74) *Attorney, Agent, or Firm* — Yuanmin Cai; Keivan Razavi

(57) ABSTRACT

A method of forming a semiconductor structure on a substrate is provided. The method may include preparing a continuous active layer on a region of the substrate and depositing a first raised epitaxial layer on a first region of the continuous active layer. A second raised epitaxial layer is also deposited on a second region of the continuous active layer such that the first raised epitaxial layer is in close proximity to the second raised epitaxial layer. A mask may be used to etch a trench structure into the continuous active layer at both the first and the second raised epitaxial layer, whereby the etched trench structure is filled with isolation material for electrically isolating the first raised epitaxial layer from the second raised epitaxial layer.

15 Claims, 27 Drawing Sheets

(56) References Cited

U.S. PATENT DOCUMENTS

| | | | |
|---|---|---|---|
| 2011/0269303 A1* | 11/2011 | Marxsen et al. | 438/586 |
| 2011/0294287 A1* | 12/2011 | Lin et al. | 438/591 |
| 2012/0153398 A1* | 6/2012 | Baars et al. | 257/369 |
| 2012/0220086 A1* | 8/2012 | Baars et al. | 438/199 |

* cited by examiner

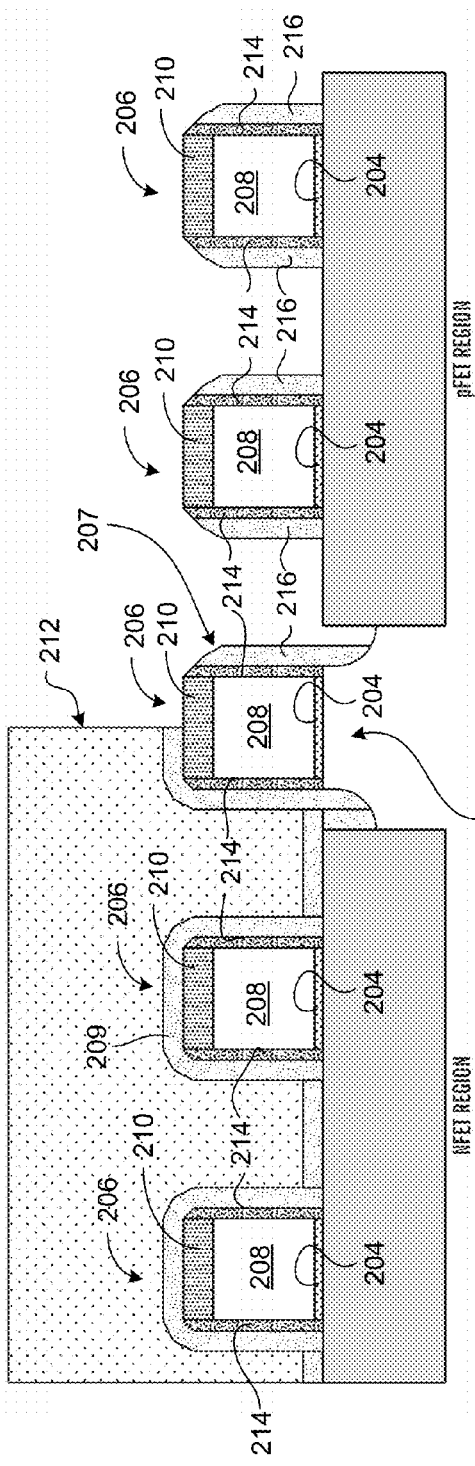
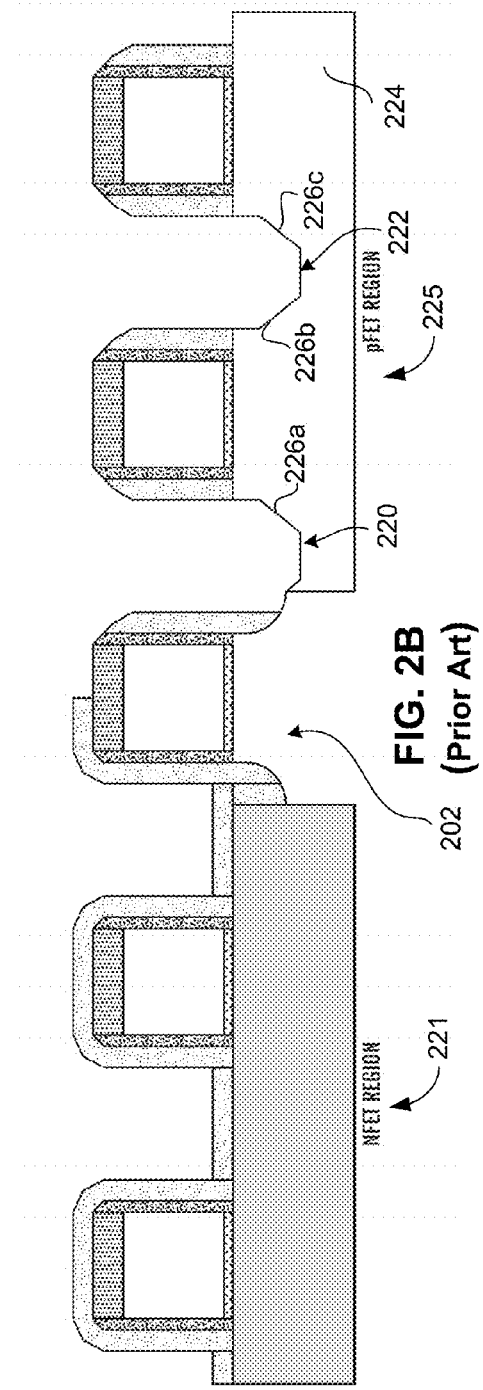
FIG. 2A (Prior Art)
FIG. 2B (Prior Art)

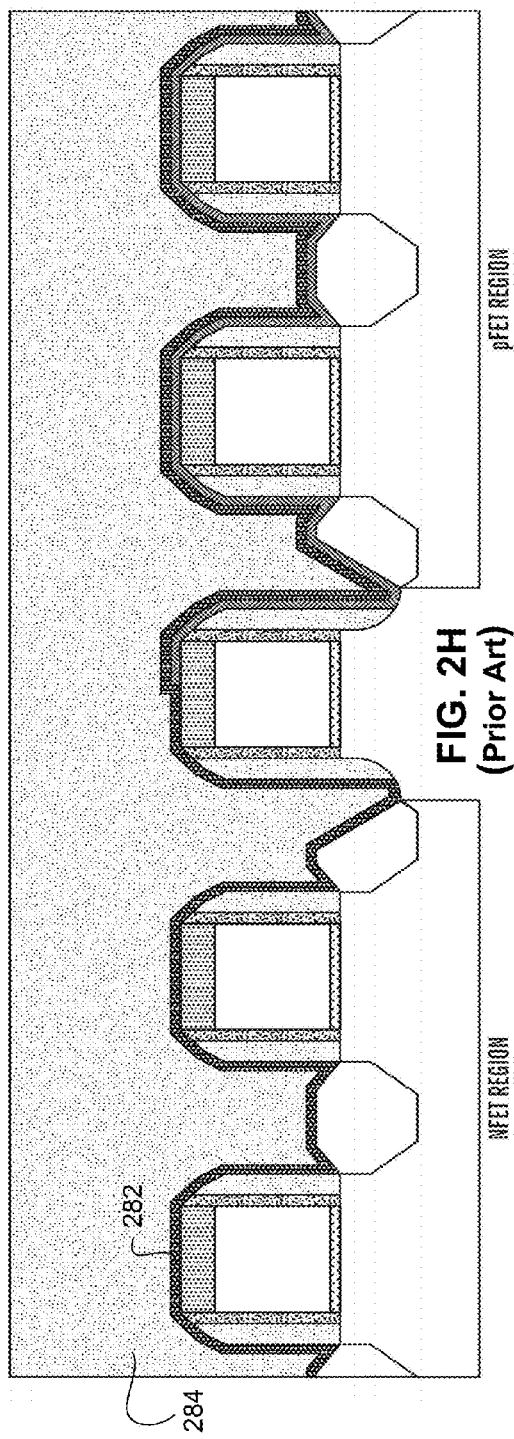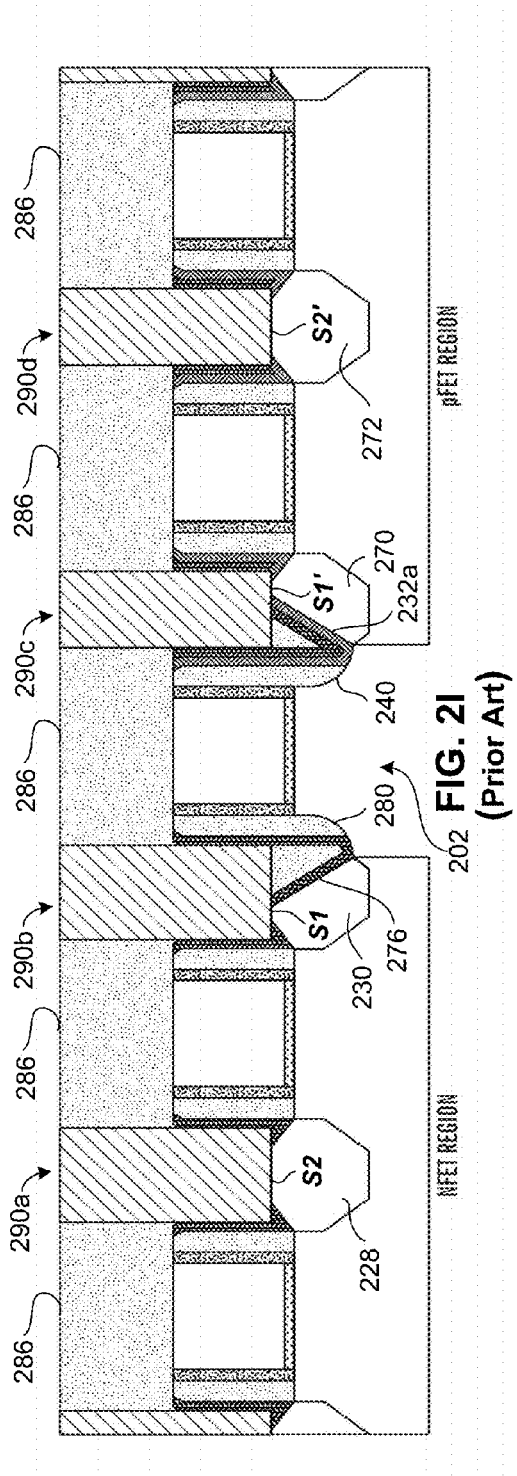

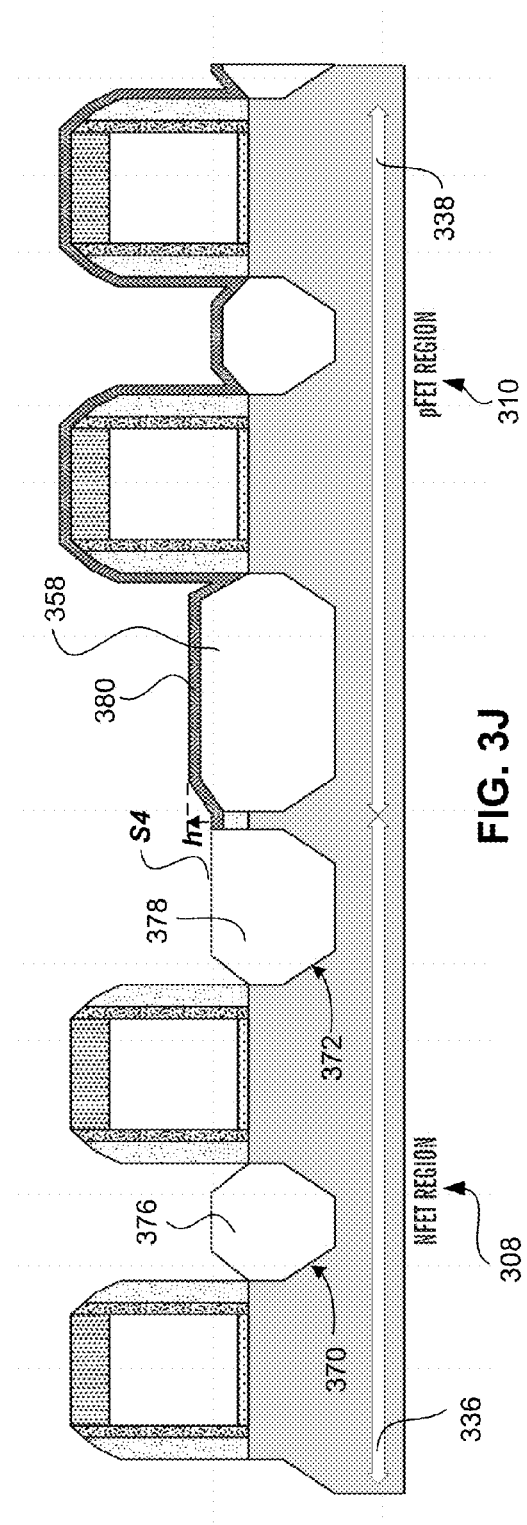
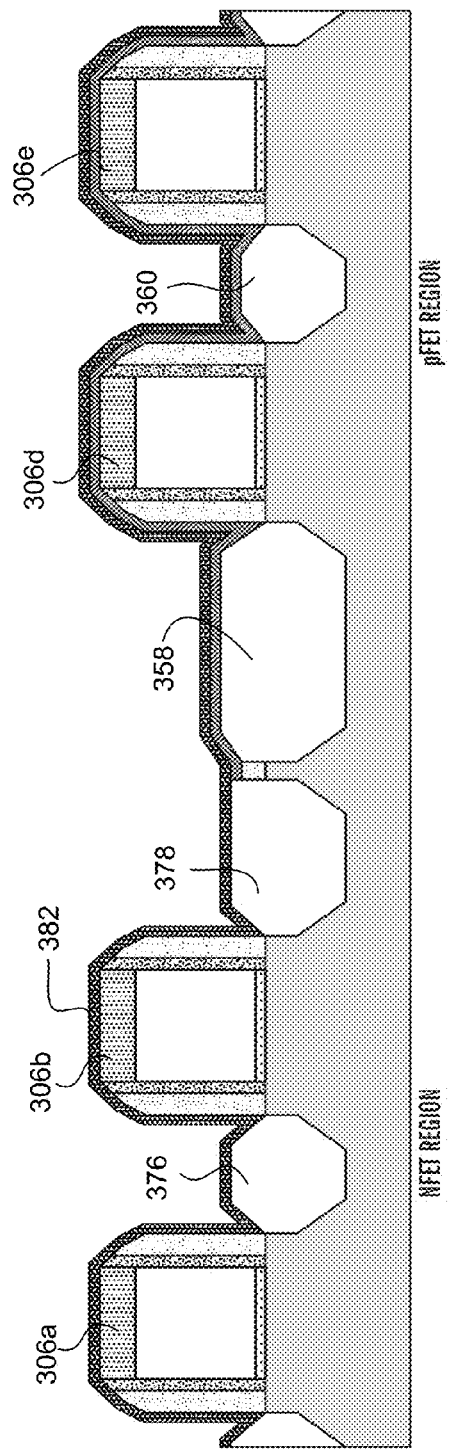

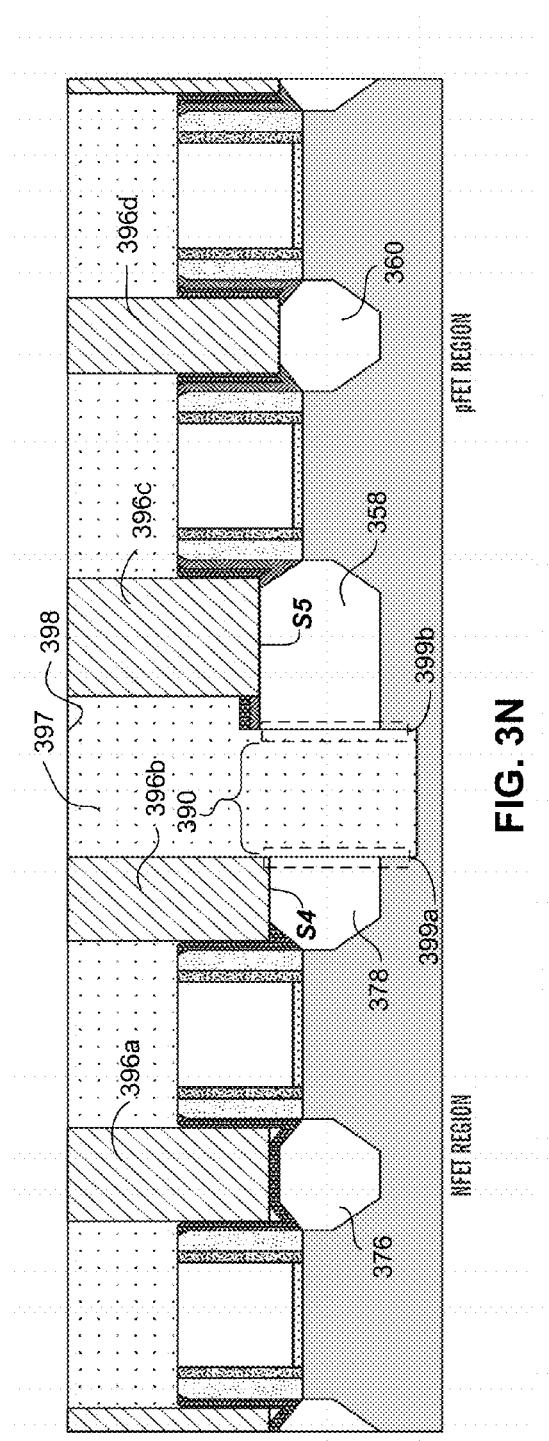
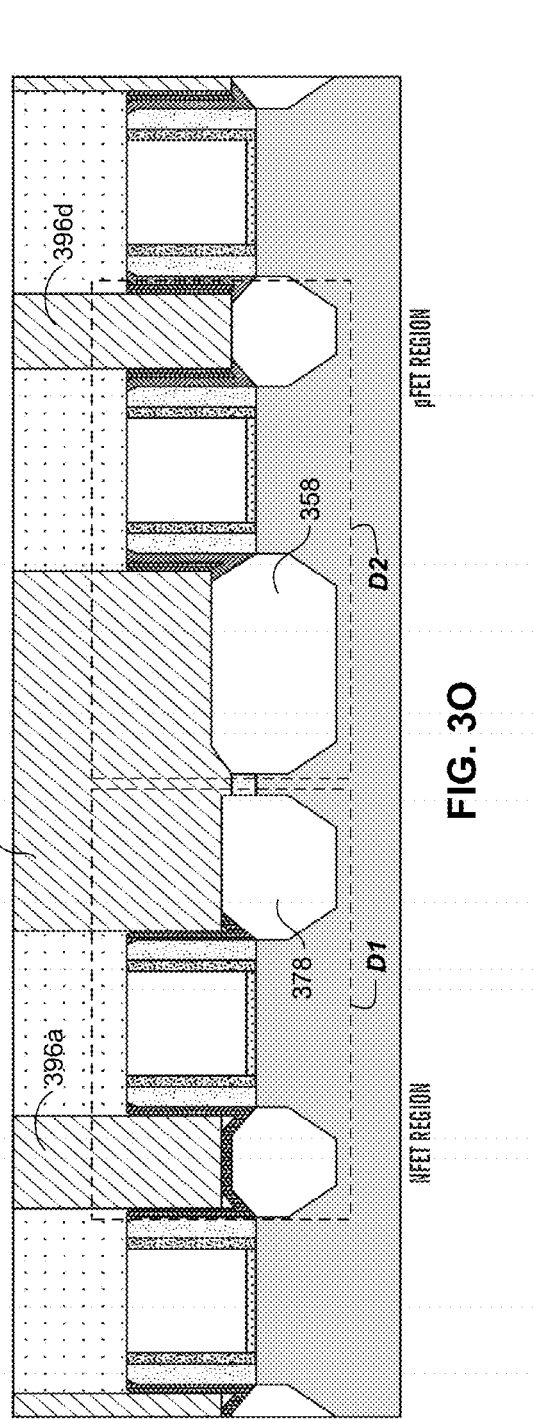
FIG. 3N
FIG. 3O

FORMING FACET-LESS EPITAXY WITH A CUT MASK

BACKGROUND a. Field of Invention

The present invention generally relates to integrated circuit devices, and particularly to forming facet-less epitaxially grown regions at isolation region edges.

b. Background of Invention

Due to the nature of epitaxial growth and certain structural features of integrated circuit devices, epitaxially grown regions may exhibit undesirably formed shapes that impact device performance and reliability. For example, the formation of epitaxially grown raised source/drain regions at the edge of shallow trench isolation (STI) regions of semiconductor devices may cause the raised source/drain regions to have facetted shapes at the STI region edges. The facetted shape of these raised source/drain regions may reduce the surface area of the raised source/drain regions. This reduced surface area in turn may undesirably increase the resistance between the raised source/drain regions and any formed contacts that are operable to provide device connectivity. Thus, since within integrated circuits a vast number of connections are needed, any degradation in connection resistance may compromise device operation within the integrated circuits and, therefore, lead to a reduction in device yield.

The following illustrated and described examples highlight some of these challenges involving the formation of epitaxially grown raised source/drain regions at the edge of shallow trench isolation (STI) regions in semiconductor devices.

FIGS. 1A-1H refer to processes directed at forming shallow trench isolation (STI) regions as is known in the art. In particular, FIGS. 1A-1F illustrate STI divot formation, which occurs naturally during typical STI processes. Although FIG. 1A shows an example silicon-on-insulator (SOI) wafer 100, similar problems may exist when this process is carried out on bulk wafers.

Referring to FIG. 1A, semiconductor wafer 100 may include a pad nitride layer 102 that is formed on a pad oxide layer 104 having a thickness of about 2-8 nm. The pad oxide layer 104 is formed on a SOI substrate 106.

A photo-resist stack 108 is formed over the pad nitride layer 102. A photo-resist stack such as stack 108 may use multiple layers. For example, an ARC (Anti-Reflective Coating) layer may be added under a photo-resist layer. Also, another form of organic under-layer material may be added under the ARC layer for planarization purpose. RIE (Reactive Ion Etching) etching utilizes multiple steps in order to etch the ARC and the organic under-layer of the photo-resist stack 108, the pad nitride layer 102, the pad oxide layer 104, and the SOI substrate 106. As illustrated, using a photo lithographic process on photo-resist stack 108, and subsequent RIE etching, trench region 110 is formed.

Referring to FIG. 1B, the photo-resist stack 108 (FIG. 1A) is first stripped by either a wet chemical or a dry strip process and is followed by performing STI fill 114 of region 110 (FIG. 1A) with HDP (High Density Plasma) oxide.

Referring to FIG. 1C, CMP (Chemical Mechanical Polishing) is performed on the structure shown in FIG. 1B in order to remove the excess STI oxide located on top of the upper surface 118 of the pad nitride 102 such that the remaining STI oxide 116 fills the STI region 110 up to the upper surface 118 of the pad nitride 102. It may be possible to lose some of the pad nitride during the CMP process.

Referring to FIG. 1D, an HF solution is used to remove some of the HDP oxide corresponding to STI oxide 116 (FIG. 1C). Thus, HDP oxide is removed from region 120 of the STI region 110, leaving remaining STI oxide 122. The amount of oxide removal depends on the remaining pad nitride, the amount of wet etch budget (up to gate insulator deposition), and STI step height target at the gate insulator deposition step.

Referring to FIG. 1E, the pad nitride 102 (FIG. 1D) is removed. As shown in FIG. 1F, the pad oxide 104 (FIG. 1D) is subsequently stripped. During the pad oxide 104 (FIG. 1E) removal process, there are several HF wet steps, which cause the removal of the HDP oxide corresponding to the STI oxide 122 and, therefore, result in the formation of STI divot. This is because the amount of removed HDP oxide from the STI 122 is greater than the thickness of the pad oxide 104. For example, due to the isotropic nature of wet chemistry, oxide is removed from all direction during the pad oxide 104 removal. As illustrated in FIG. 1G, small divots 124a, 124b are produced at the Si-STI interfaces 126a, 126b, respectively, as a result of additional pad oxide 104 (FIG. 1E) removal. The divot is created based on the silicon at the Si-STI interfaces 126a, 126b not being removed by the HF solution used in the etching process. The oxide etch step may be from a gate oxide pre-cleaning step, which removes native oxide located on the silicon surface. The pre-cleaning step may in addition remove native oxide on the wafer surface, further etching the STI oxide as well.

As shown in FIG. 1H, further oxide etching generates bigger divots 130a, 130b at Si-STI interfaces 126a and 126b, respectively.

FIGS. 2A-2K refer to processes associated with growing epitaxial regions at the edges of STI regions formed on an SOI substrate as is known in the art. In particular, FIGS. 2A-2K illustrate growing source/drain regions for nFET and pFET devices at the edge of an STI region that includes divots which are formed based on above processes described in relation to FIGS. 1A-1H.

As shown in FIG. 2A, STI isolation region 202 can be provided using the processes described and illustrated in relation to FIGS. 1A-1H. As illustrated, a centrally located poly Si or amorphous Si 208 gate electrode may be formed as a dummy gate 207 over the created STI region 202, which may correspond to region 122 as shown in FIG. 1H. A gate dielectric film 204 is formed by oxidation as either a dummy insulator or high K dielectric material. Gate 206 patterning is accomplished by poly Silicon (Si) or amorphous Si deposition 208 with optional electrode doping using Phosphorous (P) or Arsenic (As) ion implantation. Hard mask regions 210 are formed on top of the above-mentioned poly Si or amorphous Si 208 forming the gate electrodes. A typical hard mask material includes a single layer or a combination of oxide and nitride. A hard mask layer (not shown) is etched with resist patterning in order generate hard mask regions 210.

A photo-resist stack 212 may be used to cover some of the transistors in a process of forming spacers 216 of some other transistors. The photo-resist stack 212 may be formed to include multiple other layers including organic layers (not shown). By covering the nFET region using photo-resist stack 212 preceded by nitride deposition, spacers 216 are formed by spacer RIE of layer 209 in the pFET region. Multiple spacer technology may be used for device performance in modern technology. As such, spacer 216 is another spacer used in addition to spacer 214.

FIG. 2B illustrates the resulting structure following the removal of the photo-resist stack 212 (FIG. 2A), prior to or after, creating source/drain recesses 220 and 222 in the silicon layer 224 of the pFET region 225. The photo-resist stack 212 (blocking nFET region 221) may be stripped by a sulphuric acid/hydrogen peroxide solution. The source/drain recesses 220 and 222 within the silicon layer 224 may be produced by an etch process using HBr containing plasma. As illustrated, the controlled sloped profile of the produced recesses, as defined by 226a-226c, are intentionally provided for strain engineering to maximize device performance by increasing strain in the transistor channel for higher electron mobility.

Referring to FIG. 2C, epitaxial SiGe source/drain regions 228 and 230 are epitaxially grown in recesses 220 and 222, respectively. As illustrated, the resulting epitaxial profiles of the grown source/drain regions 228, 230 may have facets 232a-232d, whereby epitaxial faceting is a known phenomenon associated epitaxial processes. Accordingly, a facet is formed due to the crystalline growth (epitaxy) nature associated with directional growth properties at different surface atom concentrations. The reduced surface region S1' of source/drain region 228 compared to surface region S2' of source/drain regions 230 presents a less desirable area for contact formation.

As illustrated in FIG. 2C, at the STI-Si boundary 238 a divot 240 is created. As previously described, the divot 240 may be formed due to HF containing cleaning process steps associated with pre-gate electrode level cleaning processes. The divot 240 depth may be about 20-40 nm from the silicon surface 242. Within the STI-S1 boundary 238, since the epitaxial growth of source/drain region 228 stops at an epitaxial boundary 244 with the divot 240, the grown source/drain region 228 includes a non-symmetric shape having a relatively large facet 232a compared to source/drain region 230.

Referring to FIG. 2D, a protective layer 248 is formed within nFET region 221 in order to prevent any epitaxial growth in subsequent process steps. A typical material for the protective layer may be silicon nitride having a thickness in the range of about 5-30 nm. Photo-resist stack 250 is then provided for resist pattering in order to block pFET region 225.

Referring to FIG. 2E, spacers 254 are formed via a RIE process in the nFET region 221 only once protective layer 248 (FIG. 2D) is removed. As illustrated, the pFET region 225 is protected by photo-resist stack 250. As with FIG. 2C, in FIG. 2E, source/drain recesses 260 and 262 may be formed within silicon layer 264 of the nFET region 221. Photo-resist stack 250 may be stripped using the same or a similar process to that described in relation to FIG. 2C, either prior to or after creating the source/drain recesses 260, 262.

Referring to FIG. 2F, within nFET region 221, epitaxial Carbon doped source/drain regions 270 and 272 are epitaxially grown in recesses 260 and 262, respectively. As shown, the shape of facet 276 within nFET region 221 is the same as facet 232a (FIG. 2C) within the pFET region 225 (FIG. 2C). Facet 276, which is formed at the edge of divot 280 of STI-S1 interface 278, has a relatively larger facet that results in non-symmetrically shaped source/drain regions 270 and 272. The reduced surface region S1 of source/drain region 272 compared to surface region S2 of source/drain regions 270 presents a less desirable area for contact formation. The epitaxial source/drain regions 270, 272 may also be doped using, for example, Arsenic or phosphorus.

Referring to FIG. 2G, a MOL (Middle Of Line) liner 282 is deposited over the structure of FIG. 2F in order to protect the surfaces of epitaxially grown source/drain regions 228, 230, 270, and 272 during subsequent thermal oxidation steps.

Referring to FIG. 2H, an insulator material 284 is deposited over the structure of FIG. 2G followed by a CMP planarization step.

FIG. 2I refers to a resulting structure with typical subsequent process steps. Details of gate electrode structures are not shown in this drawing. However, any gate electrode structure may be utilized. For example, the gate electrode structure can be a RMG (Replacement Metal Gate) structure. The RMG process may include polishing insulator 284 (FIG. 2H) down to the cap nitride surface 210 (FIG. 2A), and further opening of the cap nitride by RIE or another appropriate process. An n-type device and p-type device gate is opened using a resist mask. Once the gate poly regions are exposed and removed, high K material, band gap engineered material, and metal electrode material are filled in the gate region 286. Contacts 290a-290d may be formed after RMG with insulator deposition, contact lithography, RIE, and contact metal fill process steps.

As previously described, based on the created facets 276, 232a that result from the formed divots 280, 240 associated with STI region 202, source/drain regions 230 and 270 include reduced contact surfaces S1 and S1' for connecting to contacts 290b and 290c, respectively. The reduced surfaces may establish a poor electrical connection with the contacts 290b, 290c. Poor electrical connections cause increased contact resistance and, therefore, a potential device operation failure. As illustrated, source/drain regions 228 and 272, which are not located adjacent the STI region 202, are not effected by the STI region's 202 formed divots 280, 240 and, therefore, do not exhibit the faceting observed at source/drain regions 230 and 270.

FIG. 2J shows an extreme case with under fill due to the formation of excessively large facets 292 and 293 associated with source/drain regions 297 and 298, respectively. These excessively large facets 292 and 293 may be caused by deeper STI divots 295 and 296, respectively. Thus, little to no contact is established between source/drain regions 297 and 298, and contacts 299a and 290b, respectively.

FIG. 2K shows an example of a local level (intermediate) metal connection 294 for providing electrical connectivity between the nFET and pFET region 221, 225 devices for the structure of FIG. 2I. Thus, any contact resistance degradation between surfaces S1 and S1' of source/drain regions 230 and 270, and contacts 290b and 290c, respectively, will impact the connectivity provided by metal connection 294. Since, for example, in the order of about a billion contacts and connections may be used in modern semiconductor chips, the above described connection issues may result in a significant product yield reduction. Thus, alternative isolation processes may be proposed.

BRIEF SUMMARY

According to at least one exemplary embodiment, a method of forming a semiconductor structure on a substrate is provided. The method includes preparing a continuous active layer on a region of the substrate and depositing a first raised epitaxial layer on a first region of the continuous active layer. A second raised epitaxial layer is deposited on a second region of the continuous active layer such that the first raised epitaxial layer is in close proximity to the second raised epitaxial layer. A first cut mask may be used to etch a trench structure into the continuous active layer at both the first and the second raised epitaxial layer, whereby the etched trench structure may be filled with isolation material for electrically isolating the first raised epitaxial layer from the second raised epitaxial layer.

According to at least one other exemplary embodiment, a semiconductor structure may include a substrate and a continuous active layer located on a region of the substrate. A trench structure extends into the continuous active layer. A first raised epitaxial layer is located on top of a first region of the active layer to a left side of the trench structure. The first raised epitaxial layer and the trench structure share a portion of a first sidewall, whereby the first raised epitaxial layer is facet-less at the first sidewall. A second raised epitaxial layer is located on top of a second region of the active layer to a right side of the trench structure. The second raised epitaxial layer and the trench structure share a portion of a second sidewall, whereby the second raised epitaxial layer is facet-less at the second sidewall. The trench structure may be filled with isolation material for electrically isolating the first raised epitaxial layer from the second raised epitaxial layer.

According to at least one other exemplary embodiment, a method of forming a semiconductor structure on a substrate is provided. The method may include forming a continuous active layer on a region of the substrate and depositing a first raised epitaxial layer on a first region of the continuous active layer, whereby the first raised epitaxial layer corresponds to a first device. A second raised epitaxial layer corresponding to a second device is deposited on a second region of the continuous active layer, whereby the first raised epitaxial layer is in close proximity to the second raised epitaxial layer. The first raised epitaxial layer and the second raised epitaxial layer are then electrically connected for connecting the first and the second device.

BRIEF DESCRIPTION OF THE SEVERAL VIEWS OF THE DRAWINGS

FIGS. 2A-2K are vertical cross-sectional views of a semiconductor structure that illustrate the formation of facetted epitaxial regions at the edges of STI regions, as is known in the art;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The embodiments described herein provide structures and processes for creating facet-less epitaxial growth regions (e.g., source/drain regions) at the edge of isolation regions by providing isolation between the epitaxially grown regions after the epitaxial growth of these epitaxial regions.

Figure 3A:
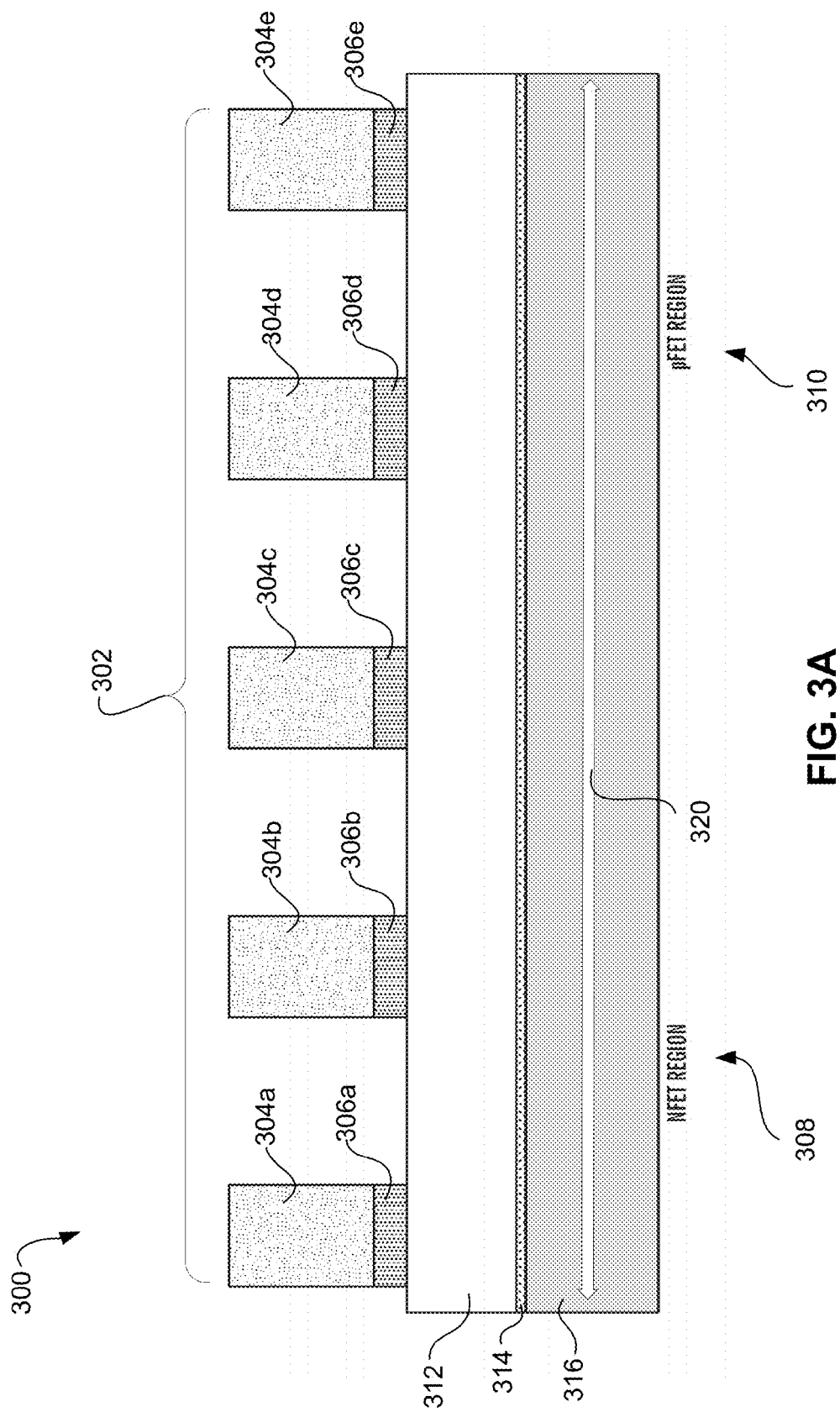
FIGS. 3A-3O are vertical cross-sectional views of a semiconductor structure that illustrate the formation of facet-less epitaxial regions, according to at least one embodiment.

FIGS. 3A-3O illustrate exemplary semiconductor structures and processes associated with forming facet-less epitaxial regions according to at least one embodiments. In particular, the exemplary embodiments of FIGS. 3A-3O illustrate the formation of facet-less epitaxial source/drain regions for adjacently located nFET and pFET devices on an SOI semiconductor substrate.

Referring to structure 300 of FIG. 3A, a gate hardmask stack 302 is produced using photo lithography and reactive ion etching (RIE) processes. At this process stage, the gate hardmask stack 302 is formed on photo resist sections 304a-304e located over cap nitride layers 306a-306e, respectively. The cap nitride may be a combination of oxide and nitride. Structure 300 may also include a gate conductor 312 and gate dielectric insulator 314. The gate conductor and gate dielectric insulator can be formed by known methods in the art. As illustrated, nFET region 308 and pFET region 310 may be formed on a continuous portion 320 of the substrate 316, which may define the active region of both the subsequently produced nFET and pFET devices (FIG. 3K). The active region of each nFET or pFET device may include the area in which the gate and the source/drain (S/D) regions are formed.

Figure 3B:
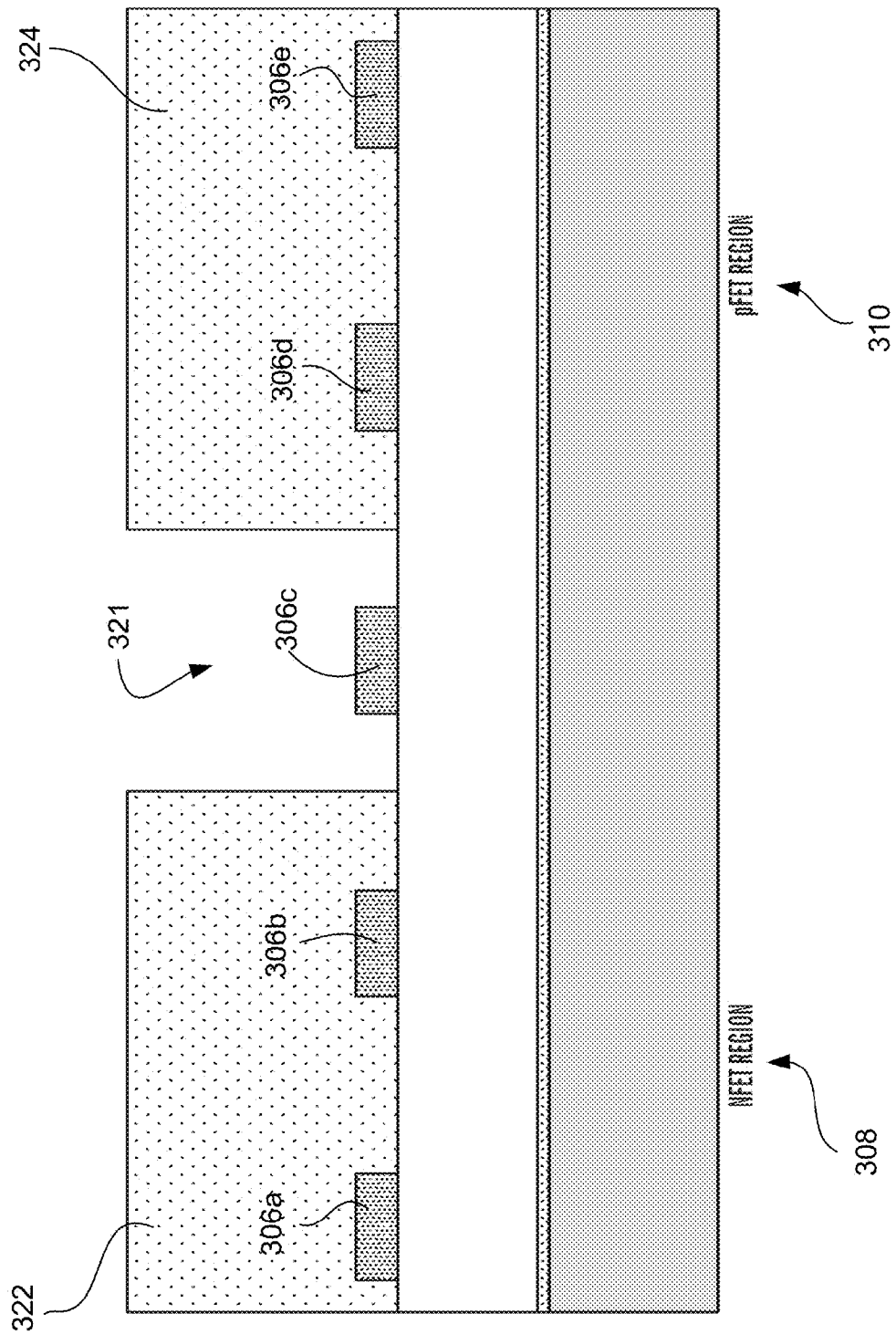
Figure 3C:
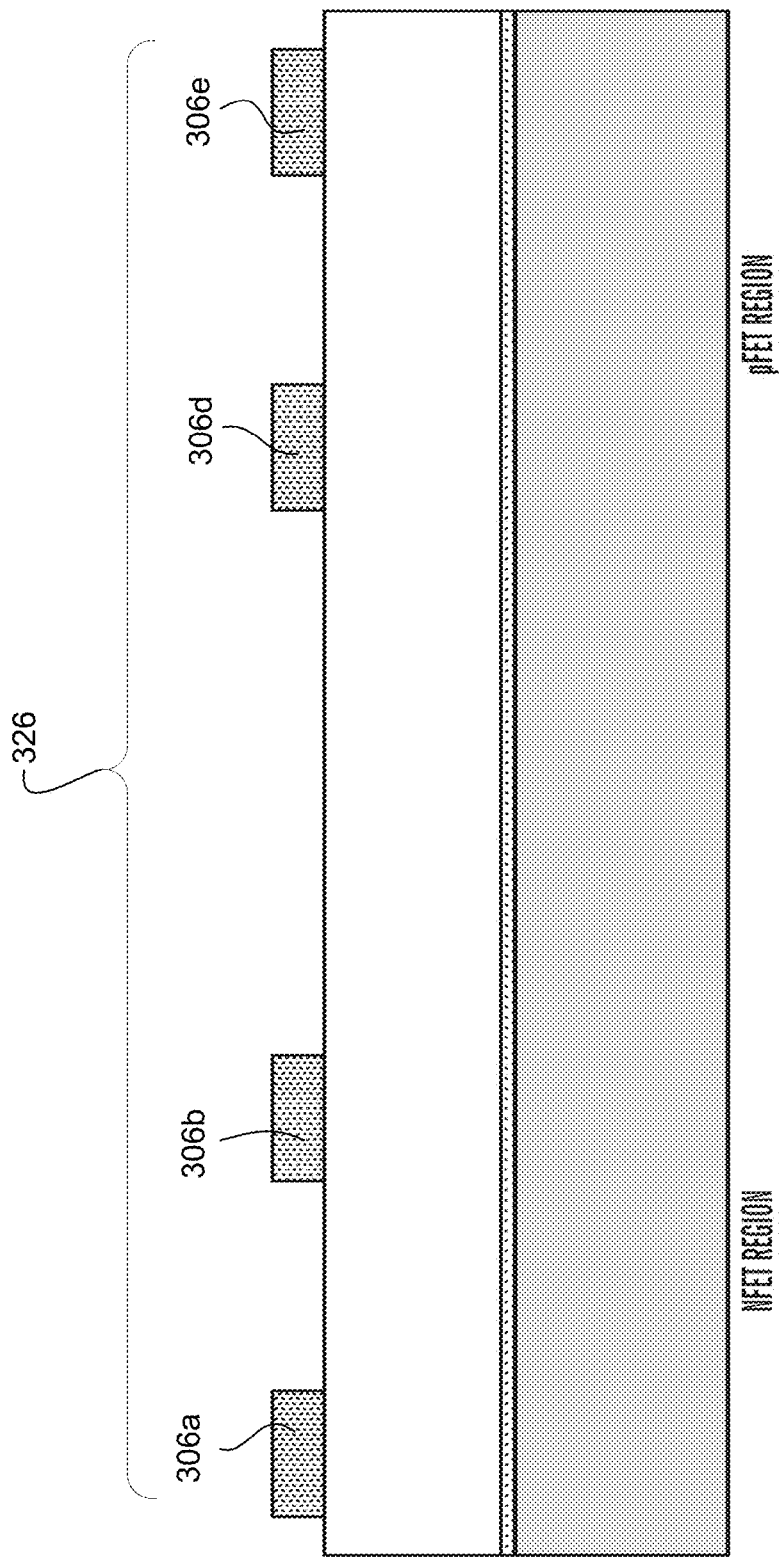

FIG. 3B illustrates the resulting structure following the removal of the photo resist sections 304a-304e (FIG. 3A) from the gate hardmask stack 302 (FIG. 3A) and exposing an opening 321 with a first cut mask (i.e., defined by a photomask) in order to expose the cap nitride layer 306c corresponding to a dummy gate, which shall be removed in subsequent process steps (e.g., dry etching). Accordingly, the cut first mask is used to expose the dummy gate cap nitride layer 306c. Although it may be simpler to not print the dummy gate cap nitride layer 306c from the beginning, it is, however, a well known practice to add a dummy gate to improve lithography resolution and simplify OPC (Optical Proximity Correction) for photo mask generation. Thus, a cut mask is used to remove the cap nitride layer 306c associated with the printed dummy gate. Accordingly, photo resist section 322 protects the gate region cap nitride layers 306a, 306b in the nFET region 308, while photo resist section 324 protects the gate cap nitride layers 306d, 306e in pFET region 310. Referring to FIG. 3C, cap nitride layers 306a-306b and 306c-306d, which were protected by respective photo resist sections 322 (FIG. 3B) and 324 (FIG. 3B) remain, while the cap nitride layer 306c (FIG. 3B) of the dummy gate is etched away using, for example, an RIE process similar to the formation of 306a-306e in FIG. 3A.

Figure 1A:
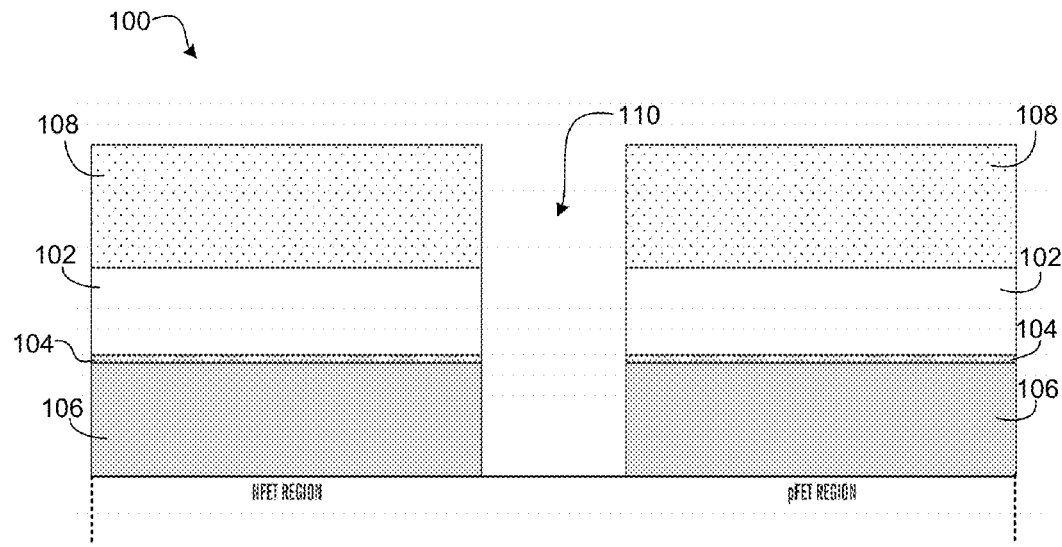
FIGS. 1A-1H are vertical cross-sectional views of a semiconductor wafer structure during the forming of shallow trench isolation (STI) regions, as is known in the art.
Figure 1B:
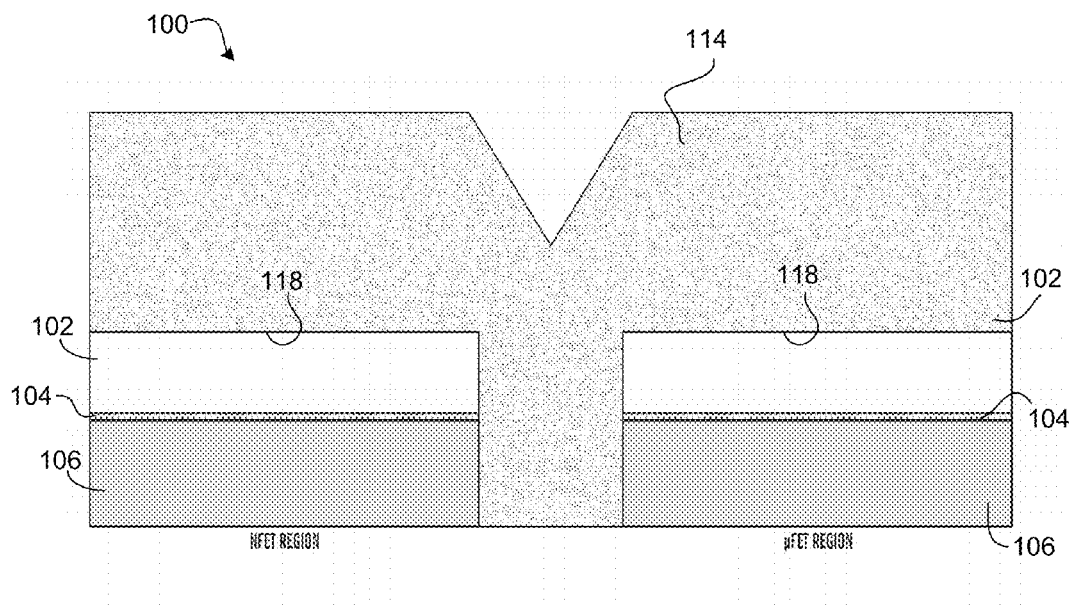
Figure 1C:
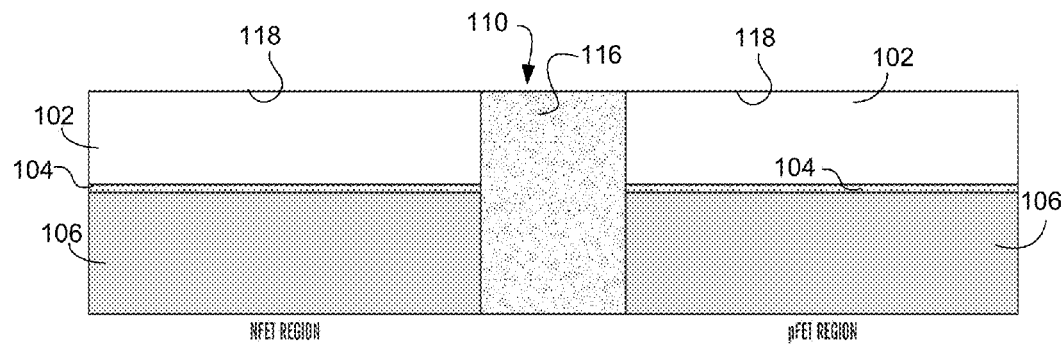
Figure 1D:
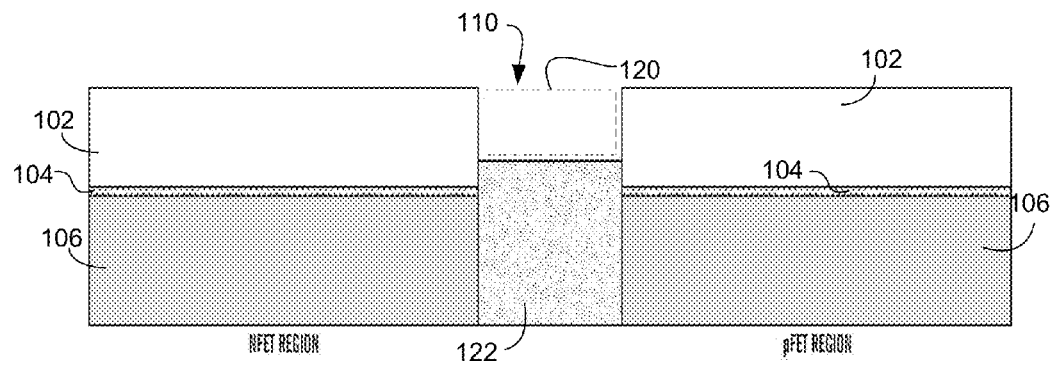
Figure 1E:
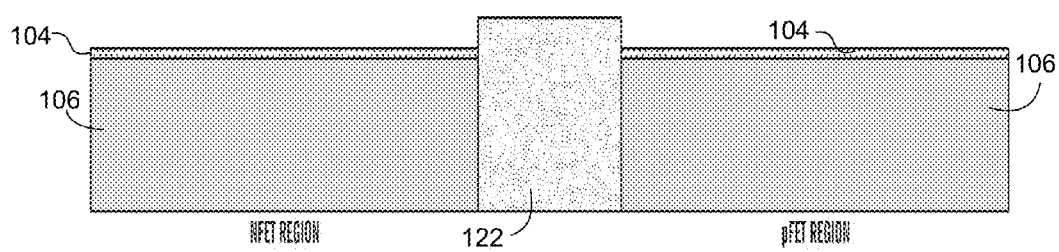
Figure 1F:
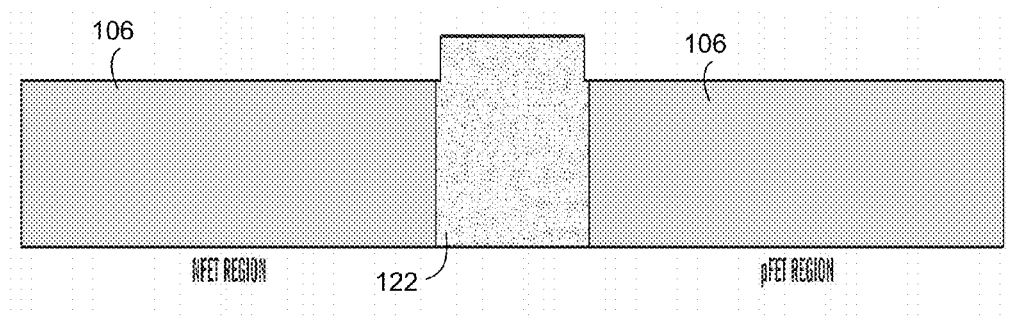
Figure 1G:
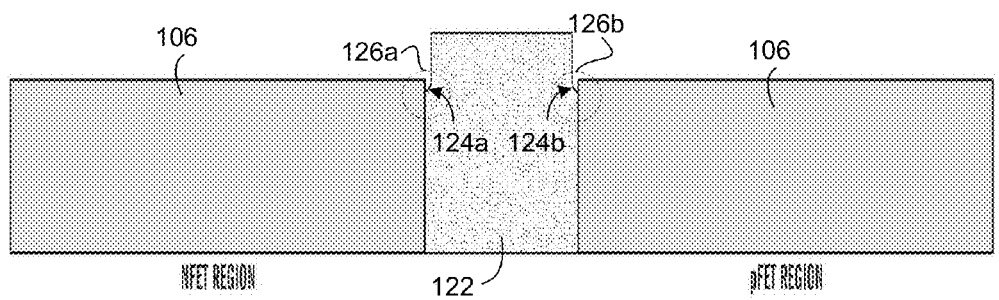
Figure 1H:
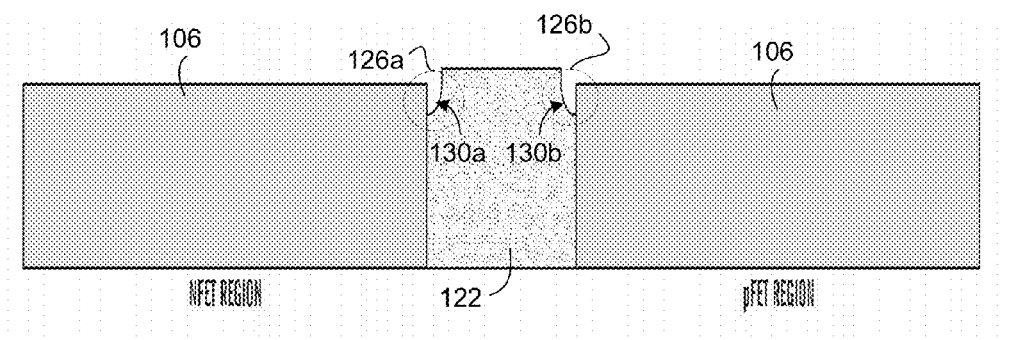
Figure 2C:
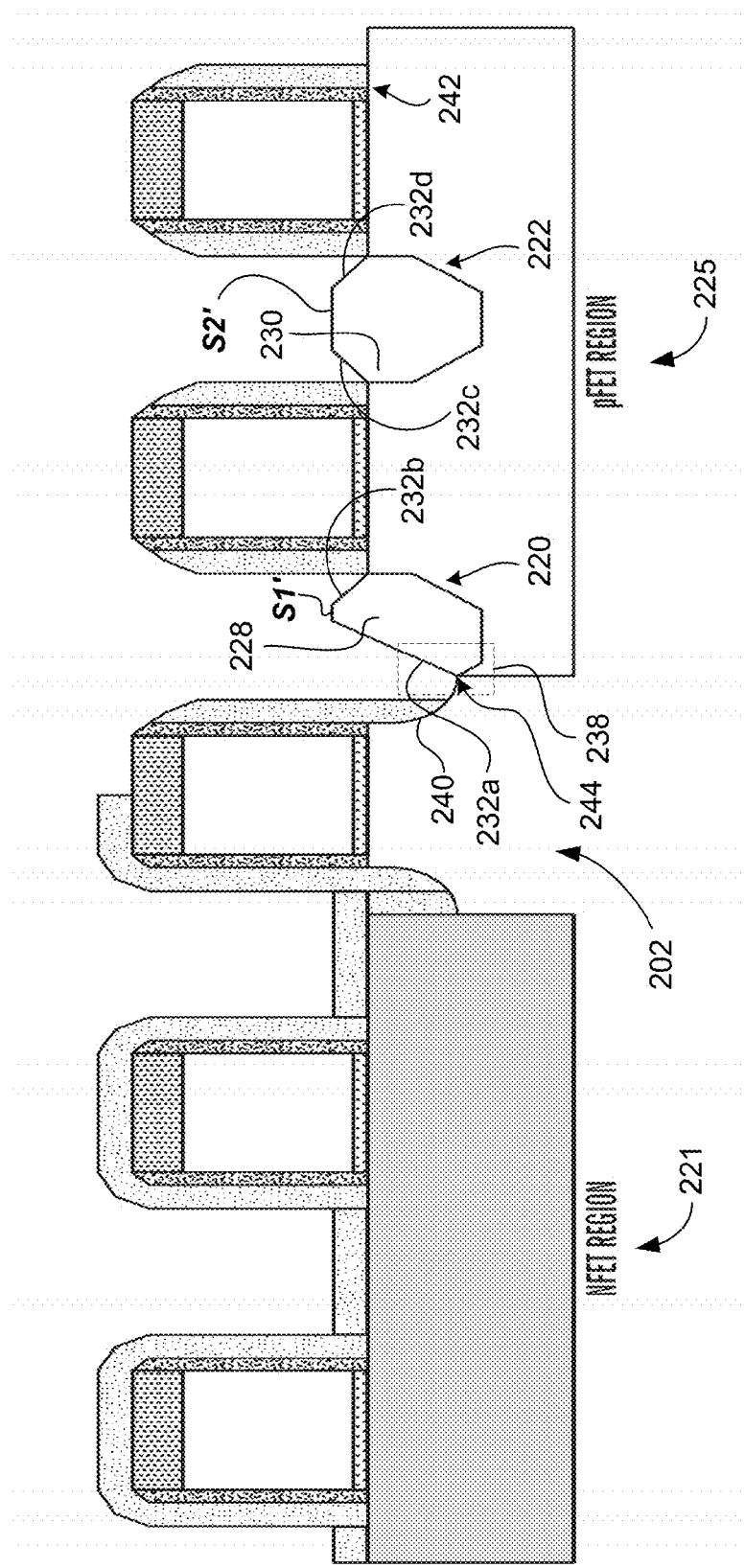
Figure 2D:
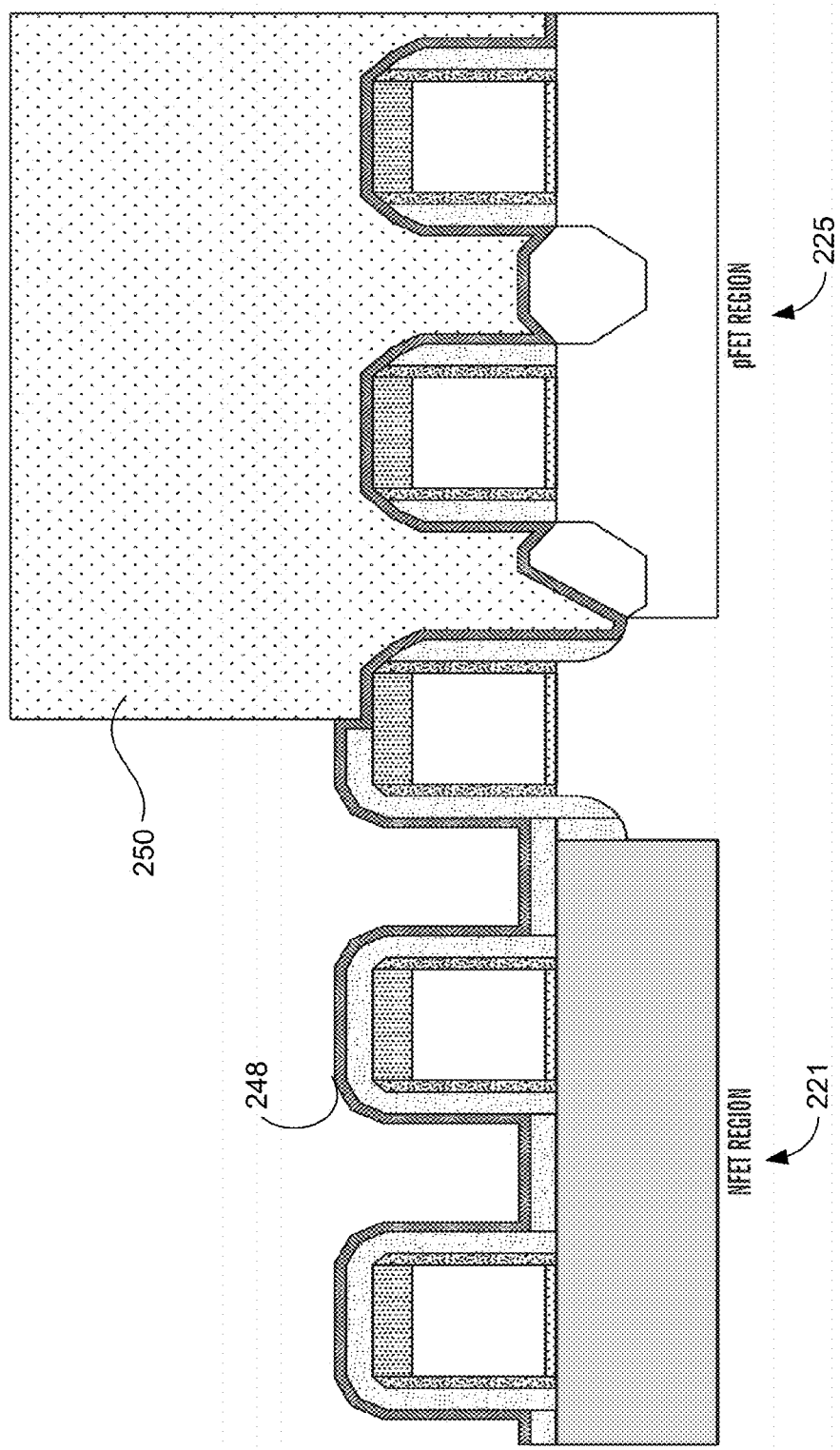
Figure 2E:
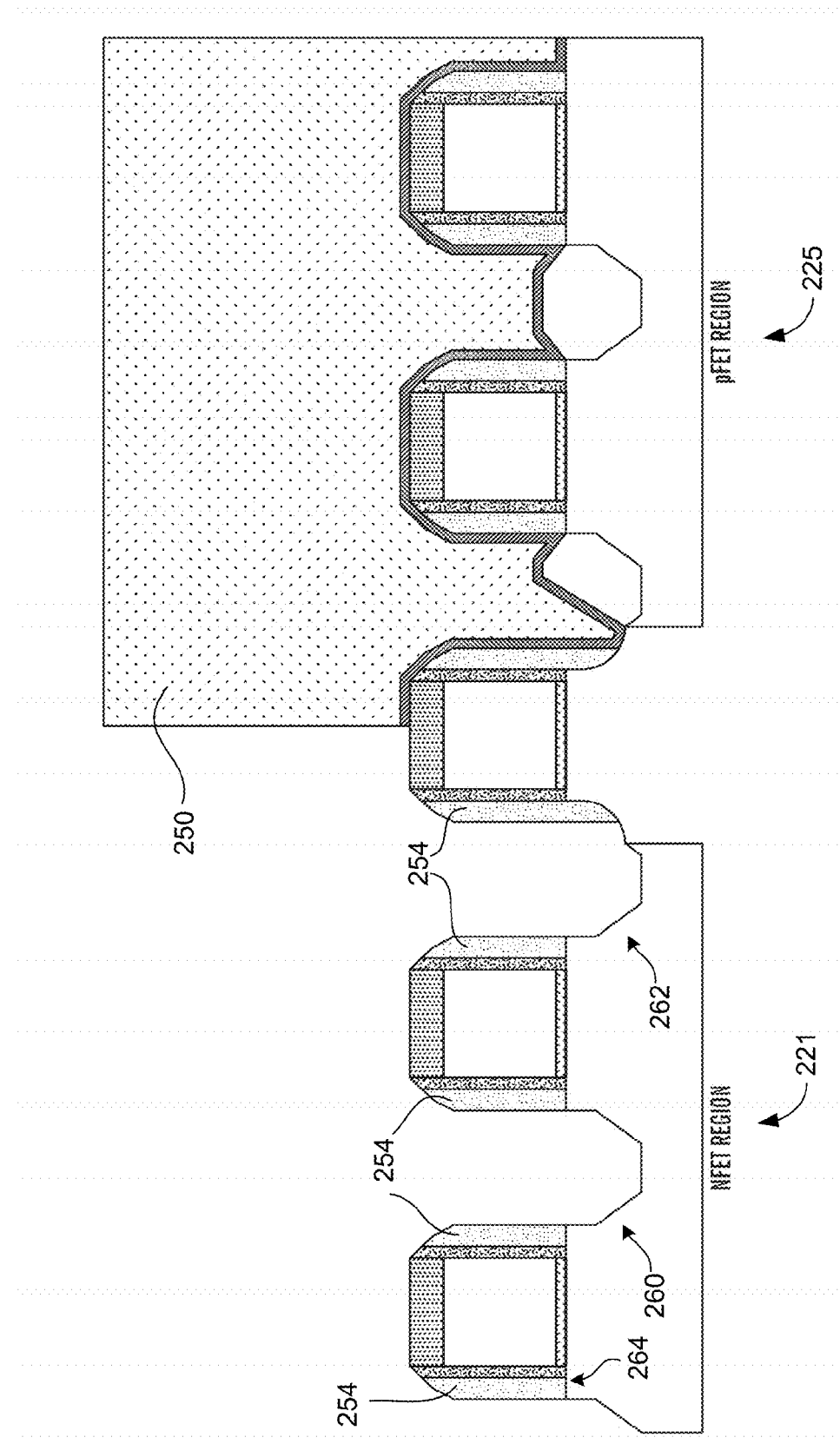
Figure 3D:
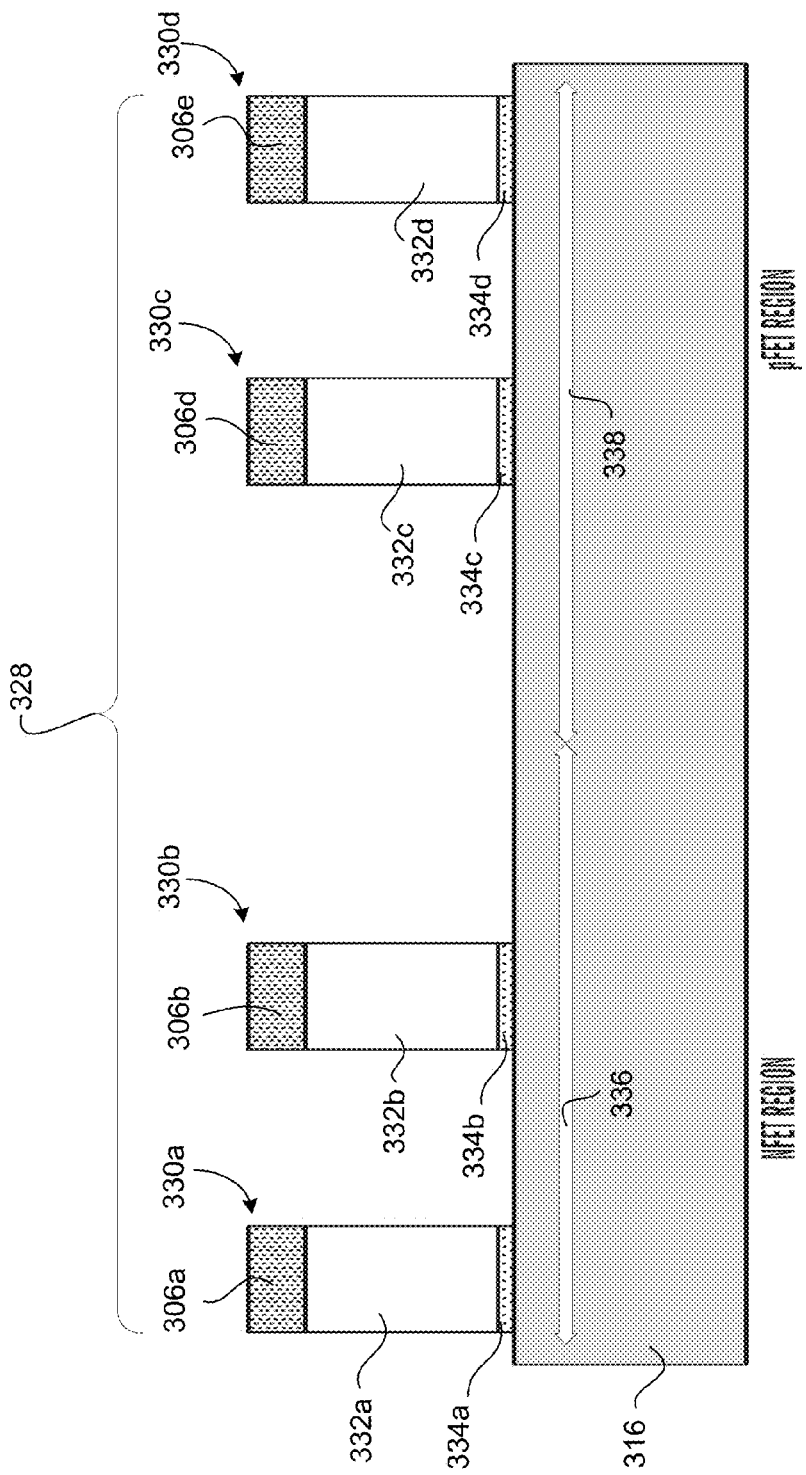

Referring to FIG. 3D, region 326 (FIG. 3C) may undergo a RIE process in order to produce gate structure 328. As illustrated, gates 330a-330d of gate structure 328 are formed on SOI substrate 316 and include cap nitride layers 306a, 306b, 306d, and 306e; gate electrode layers 332a-332d, and gate dielectric insulator 334a-334d, respectively. In contrast with the structure described in FIG. 2A, the active area of the nFET region 336 and the active area of the pFET region 338 located on the SOI substrate 316 are not separated by the STI 202 (FIG. 2A). Rather, as defined by region 320 (FIG. 3A), the active areas of the nFET region 336 and the active areas of the pFET region 338 are continuous and not separated by any isolation region until later process stages.

Figure 3E:
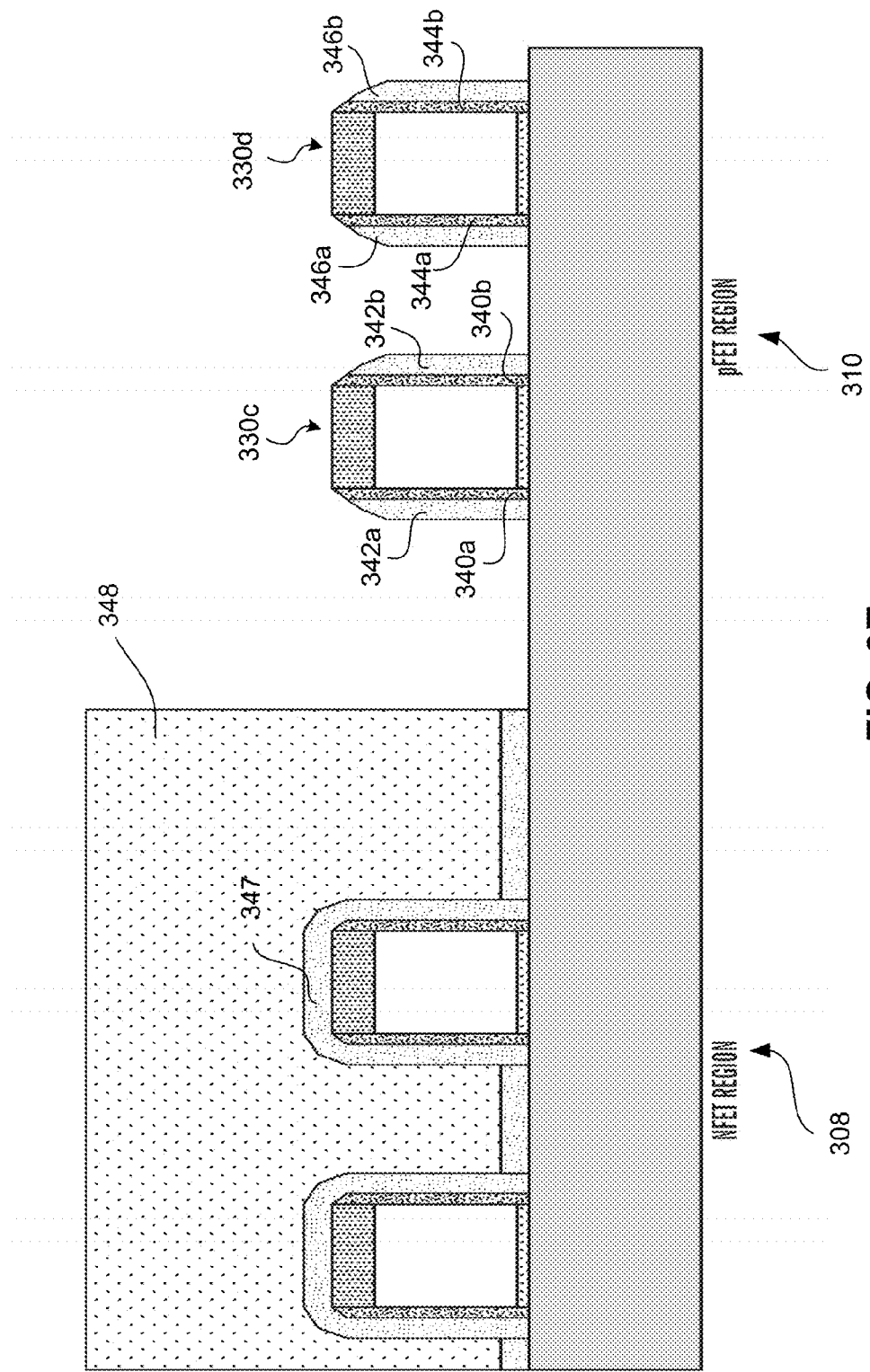

Referring to FIG. 3E, using the same processes or similar processes to those described in relation to FIG. 2A, a first set of spacers 340a, 340b and a second set of spacers 342a, 342b are formed on gate 330c. Similarly, a first set of spacers 344a, 344b and a second set of spacers 346a, 346b are formed on gate 330d. During the spacer deposition process, gates 330a and 330b of the nFET region 308 are protected by hard mask 347 and photo resist 348.

Figure 3F:
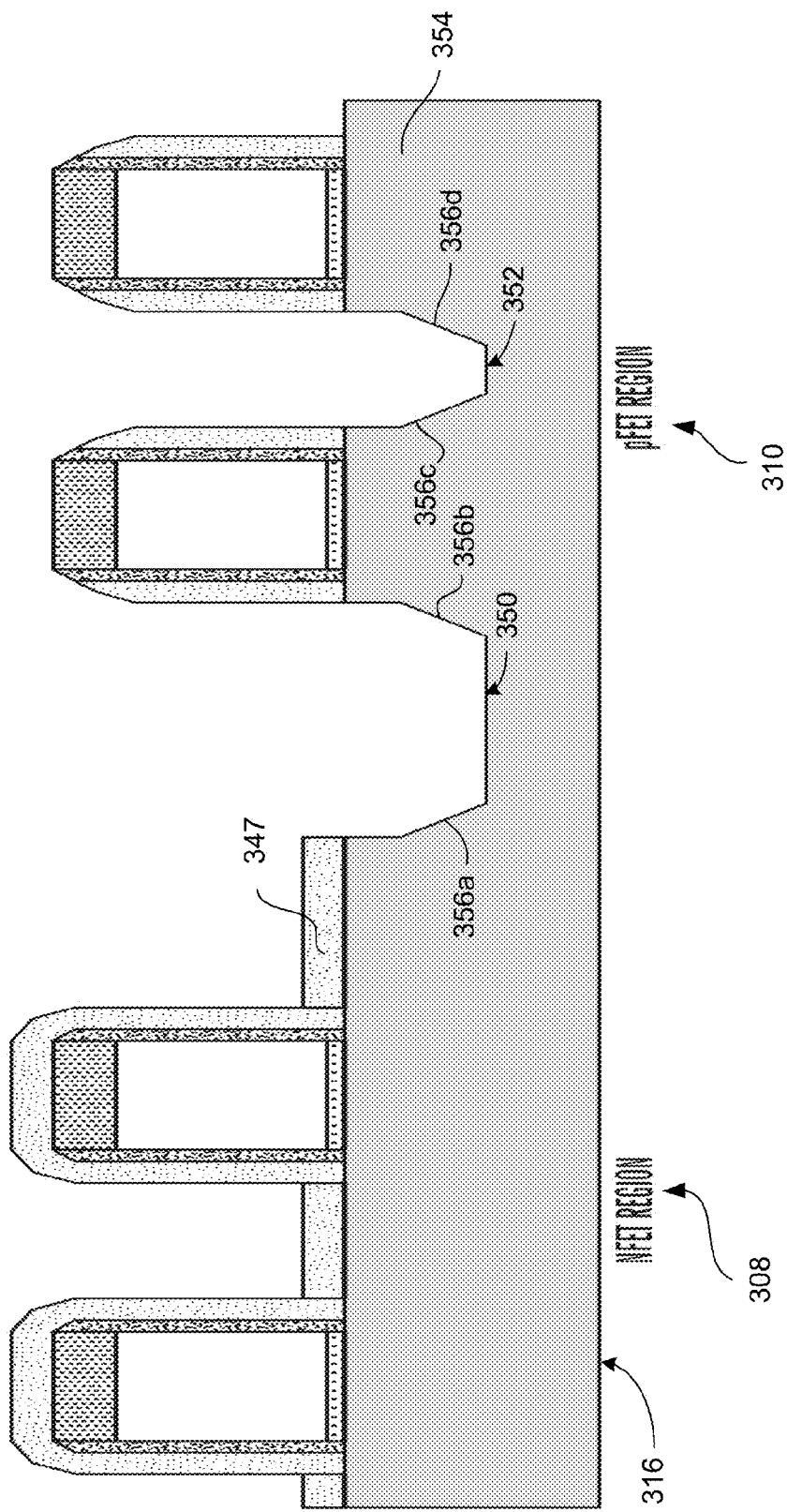

FIG. 3F illustrates the resulting structure following the removal of photo-resist stack 348 (FIG. 3E), prior to or after, creating source/drain recesses 350 and 352 in the silicon layer 354 of the pFET region 310 of SOI layer 316. As previously described, the photo-resist 348 (blocking nFET region 308) in FIG. 3E may be stripped by a sulphuric acid/hydrogen peroxide solution and or plasma strip in oxygen or hydrogen plasma. The source/drain recesses 350 and 352 within the silicon layer 254 may be produced by an etch process using HBr containing plasma. As illustrated, the controlled sloped profile of the produced recesses, as defined by 356a-356d, may be intentionally provided for strain engineering to maximize device performance by increasing strain in the transistor channel for higher electron mobility.

Figure 3G:
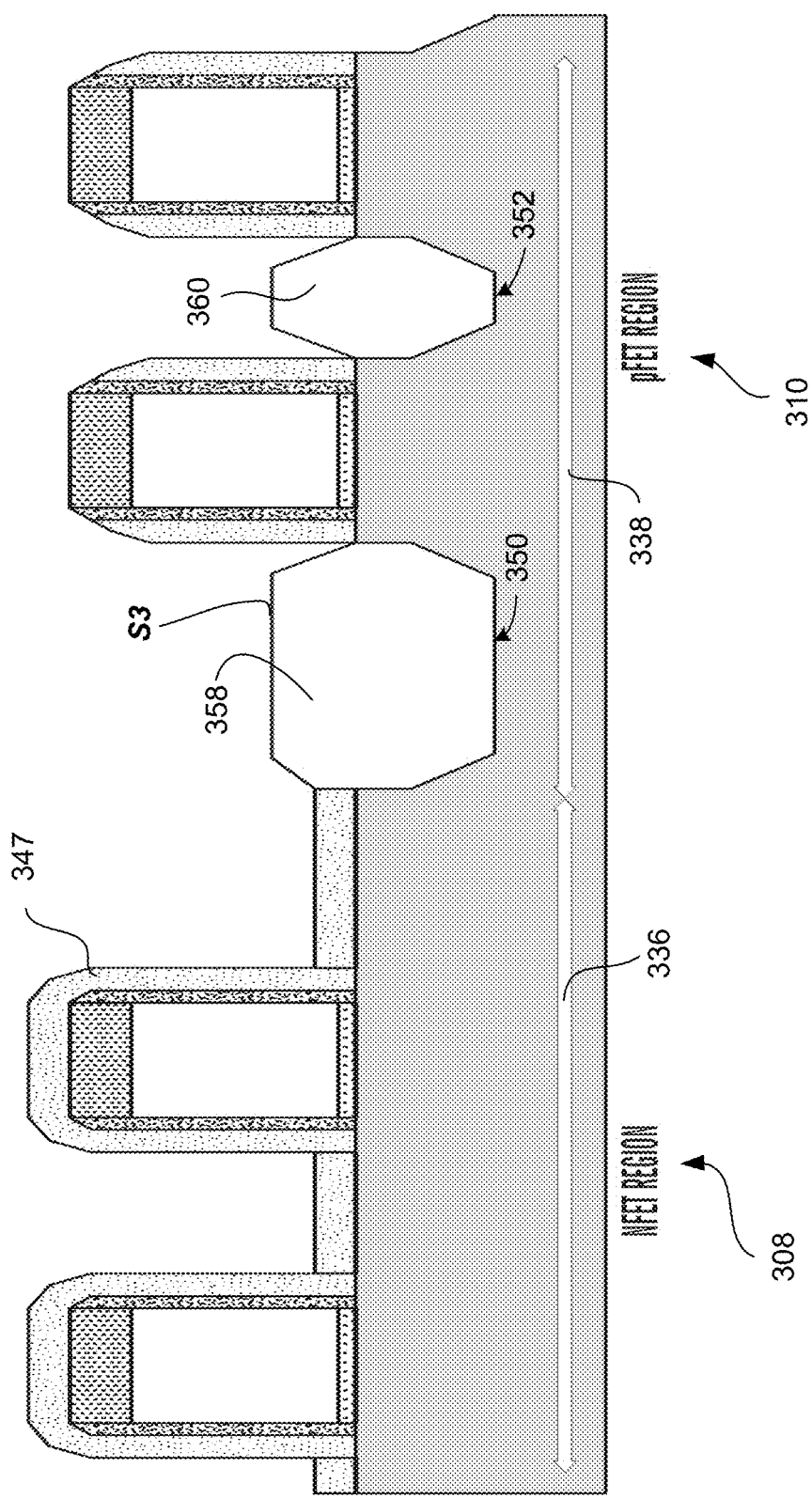

Referring to FIG. 3G, epitaxial SiGe source/drain regions 358 and 360 may be epitaxially grown in recesses 350 and 352, respectively. The epitaxial SiGe material contains SiGe, where the concentration of Ge may be around 15-35% for optimal performance. Epitaxial growth conditions may include a $GeH_4$ and $SiH_4$ ($SiH_2Cl_2$) mixture in a hydrogen ambient, at a temperature range of about 500-900 C, and under a pressure in the range of approximately 0.1-100 Torr. Pre-cleaning prior to epitaxial growth may be an important factor for quality concerns. For example, a typical process may be an HF containing wet clean to terminate with hydrogen at the Si surface. Also, a hydrogen bake may be a typical process before epitaxial growth. As illustrated, in contrast to the structure of FIG. 2C, the resulting epitaxial profile of the grown source/drain region 358 may not exhibit a relatively large isolation region (i.e., STI region) facet 232a (FIG. 2C), as produced in source/drain region 228 (FIG. 2C). Accordingly, the surface region S3 of source/drain region 358 may not exhibit a reduced surface region Si (FIG. 2C) such as source/drain region 228 (FIG. 2C). The epitaxial SiGe source/drain regions 258, 360 may be doped using, for example, Boron as a pFET Source/Drain dopant.

As previously described in relation to FIG. 2C, the STI region 202 and divot 240, coupled with the nature of epitaxial growth, may contribute to creating an undesirable faceting (e.g., facet 232a) at the edge of the isolation region 238. In contrast, in FIG. 3G the epitaxial SiGe source/drain regions 358, 360 are formed on a continuous active region that may include nFET active region 336 and pFET active region 338. The continuous active region thus facilitates the epitaxial growth of source/drain regions 358, 360 prior to the formation of an isolation region such as divoted STI region 202 (FIG. 2C), which in turn may avoid the faceting (e.g., FIG. 2C: facet 232a) that is observed in the structure of FIG. 2C.

Figure 3H:
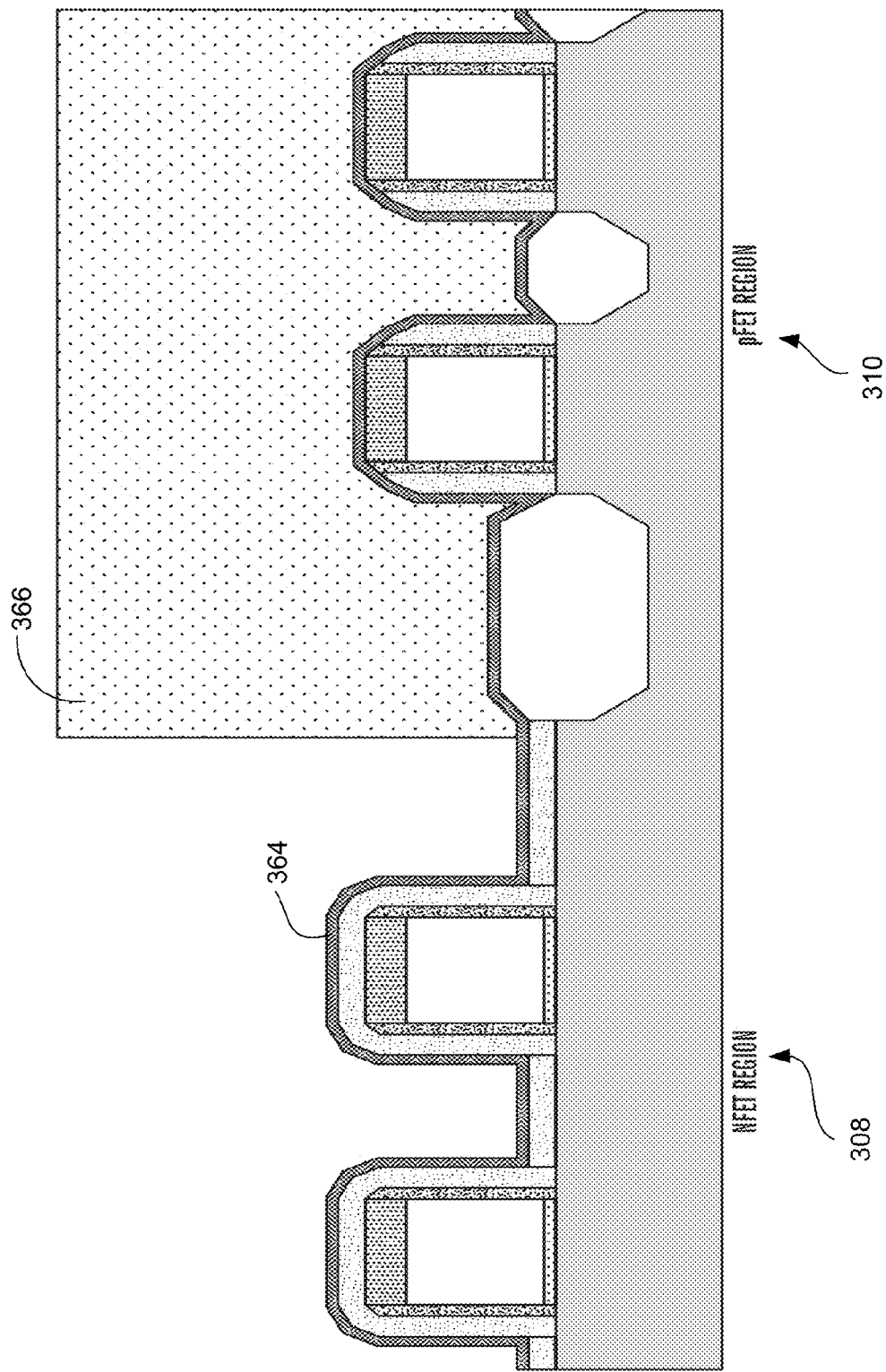

Referring to FIG. 3H, a protective layer 364 may be formed within both nFET region 308 and pFET region 310 in order to prevent any epitaxial growth in subsequent process steps. A typical material for the protective layer may be silicon nitride having a thickness in the range of about 5-30 nm. Silicon nitride may be formed with LPCVD in $NH_3$ and $SiH_2Cl_2$ ambient, and at a temperature range of approximately 300-800 C, or alternatively, using another variation of the LPCVD process (e.g., MLD: Molecular Layer Deposition). Photoresist 366 is then provided for resist patterning in order to block or mask pFET region 310.

Figure 3I:
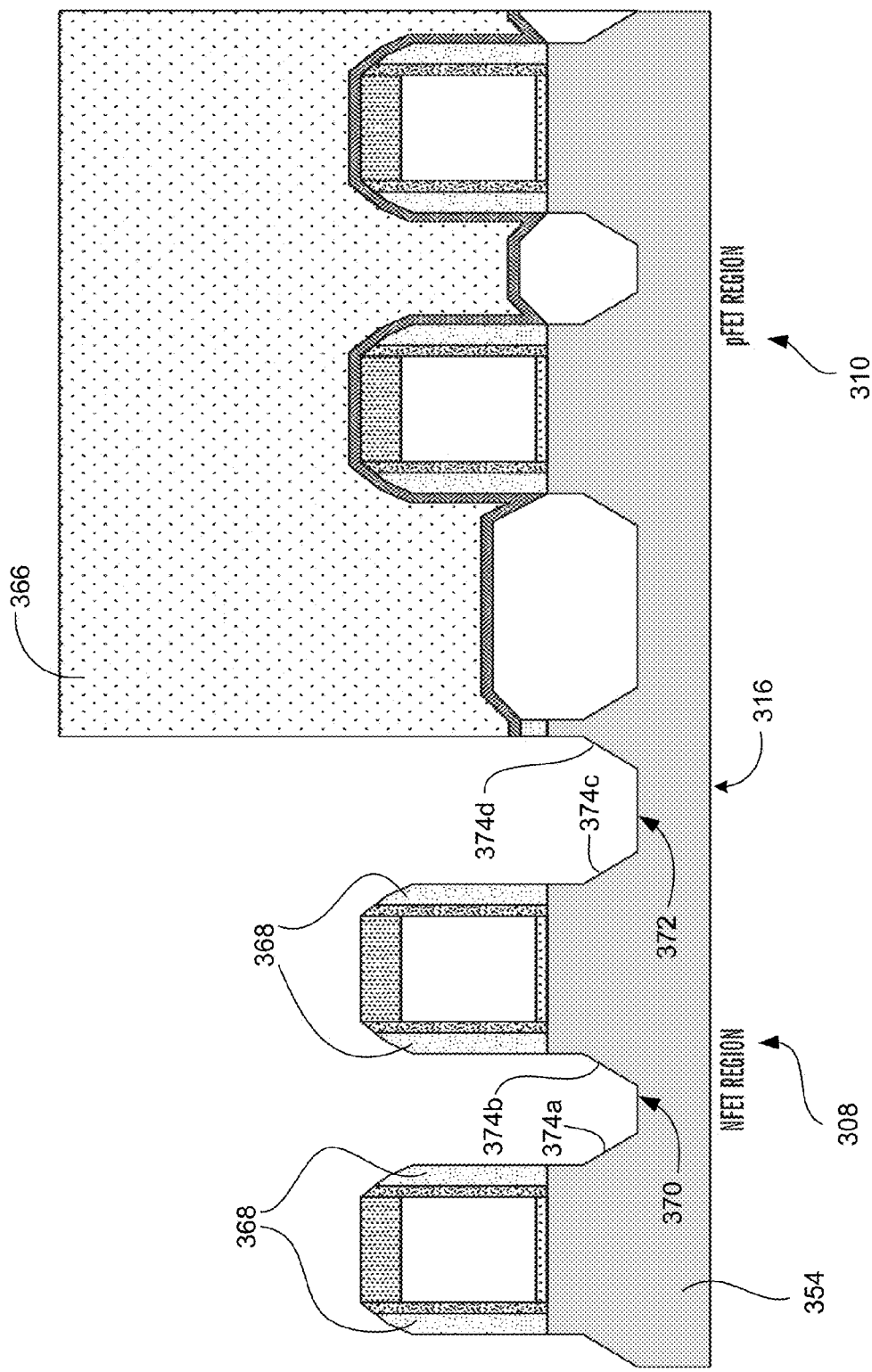

Referring to FIG. 3I, spacers 368 are formed via a RIE process in the nFET region 308 only. Spacers 368 may be a combination of hardmask 347 (FIG. 3G) and protective layer 364 (FIG. 3H). As illustrated, the pFET region 310 is protected by photo-resist 366. Source/drain recesses 370 and 372 are formed within silicon layer 354 of the nFET region 308 of SOI layer 316. The photo-resist 366 (blocking pFET region 310) may be stripped by a sulphuric acid/hydrogen peroxide solution and or plasma strip in oxygen or hydrogen plasma. The source/drain recesses 370 and 372 within the silicon layer 354 may be produced by an etch process using HBr containing plasma. As illustrated, the controlled sloped profile of the produced recesses, as defined by 374a-374d, may be intentionally provided for strain engineering to maximize device performance by increasing strain in the transistor channel for higher electron mobility.

Referring to FIG. 3J, within nFET region 308, carbon doped source/drain regions 376 and 378 may be epitaxially grown in recesses 370 and 372, respectively. The carbon concentration for the epitaxial source/drain regions 370, 372 may be in the range of about 0.1-10% (atomic percentage) depending on the required strain in the channel region. Carbon concentration may, therefore, be adjusted to maximize strain in the channel in order to enhance electron mobility. Excessive carbon concentration may, on the other hand, relax strain in the channel due to defect formation. Adequate carbon concentration may depend on all process steps, including thermal budget considerations and defects formed typically due to ion implantation.

Figure 2F:
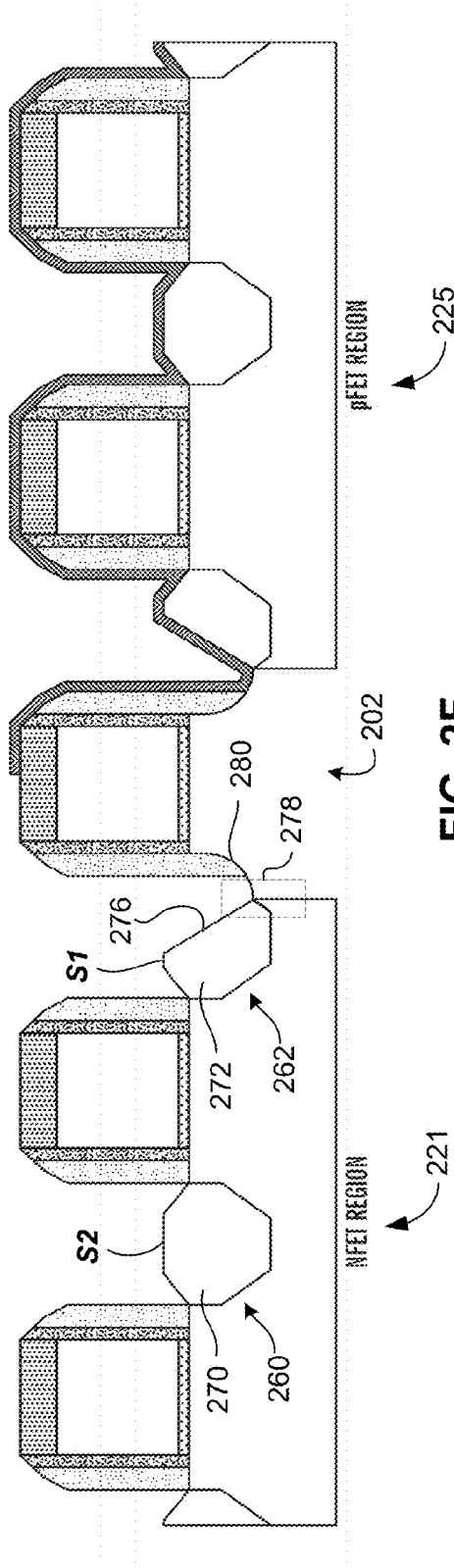
Figure 2G:
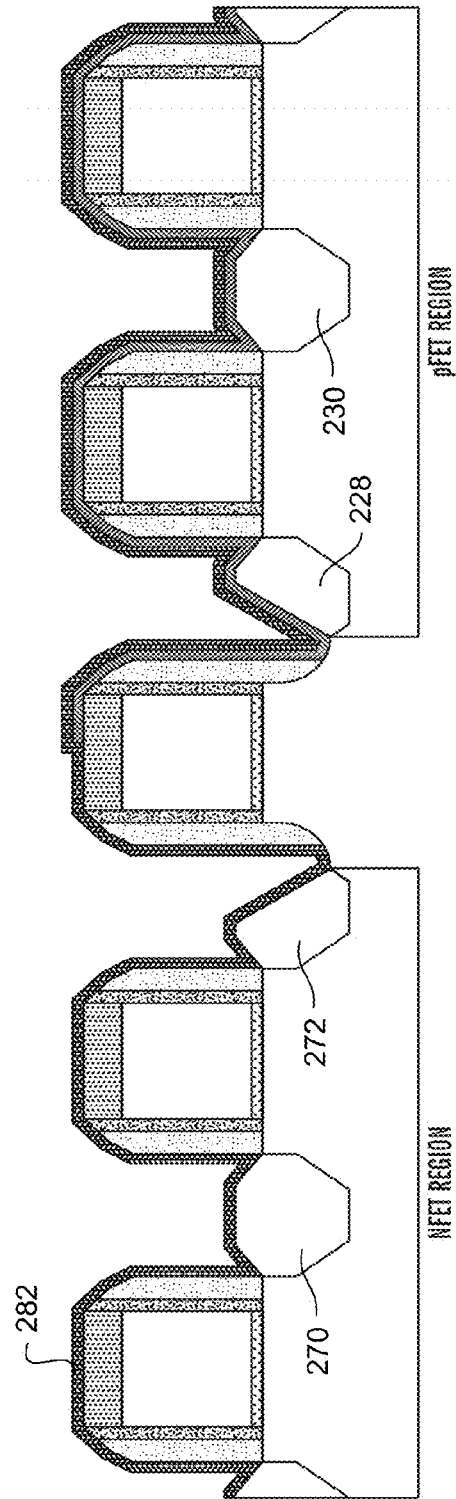

As described in relation to FIG. 2F, the STI region 202 and divot 280, coupled with the nature of epitaxial growth, contribute to creating the undesirable faceting (e.g., facet 276) at the edge of the STI isolation region 278. In FIG. 3J the epitaxial Carbon doped source/drain regions 376, 378 are instead formed on the continuous active region including nFET active region 336 and pFET active region 338. As illustrated, in contrast to the structure of FIG. 2F, the resulting epitaxial profile of the grown source/drain region 378 may not exhibit the relatively large isolation region (i.e., STI region) facet 276 (FIG. 2F), as produced in source/drain region 272 (FIG. 2F). As shown in FIG. 3J, the surface region S4 of source/drain region 358 does not exhibit a reduced surface region S1 (FIG. 2F) such as source/drain region 272 (FIG. 2F). The epitaxial Carbon doped source/drain regions 376, 378 may be doped using, for example, Arsenic or phosphorus. Moreover, referring to FIG. 3J, remaining protective layer 380 of protective layer 364 (FIG. 3H) may create a higher facet initiation location (i.e., denoted by h) for source/drain region 378 of the nFET region 308 relative to source/drain region 358 of the pFET region 310. According to an additional aspect, this higher facet initiation location, which is much higher than that of known STI bounded structures, may depend on the thickness of remaining protective layer 380.

As previously described, the continuous active region, defined by 336 and 338, facilitates the epitaxial growth of source/drain regions 370, 372 prior to the formation of an isolation region in between. This in turn avoids the faceting (e.g., FIG. 2F: facet 276) that is observed in the structure of FIG. 2F. Thus, both the nFET and pFET epitaxial source/drain regions 378, 358 are grown prior to providing any isolation between the nFET region 308 and the pFET region 310 as a distinctive feature of this invention.

Figure 3L:
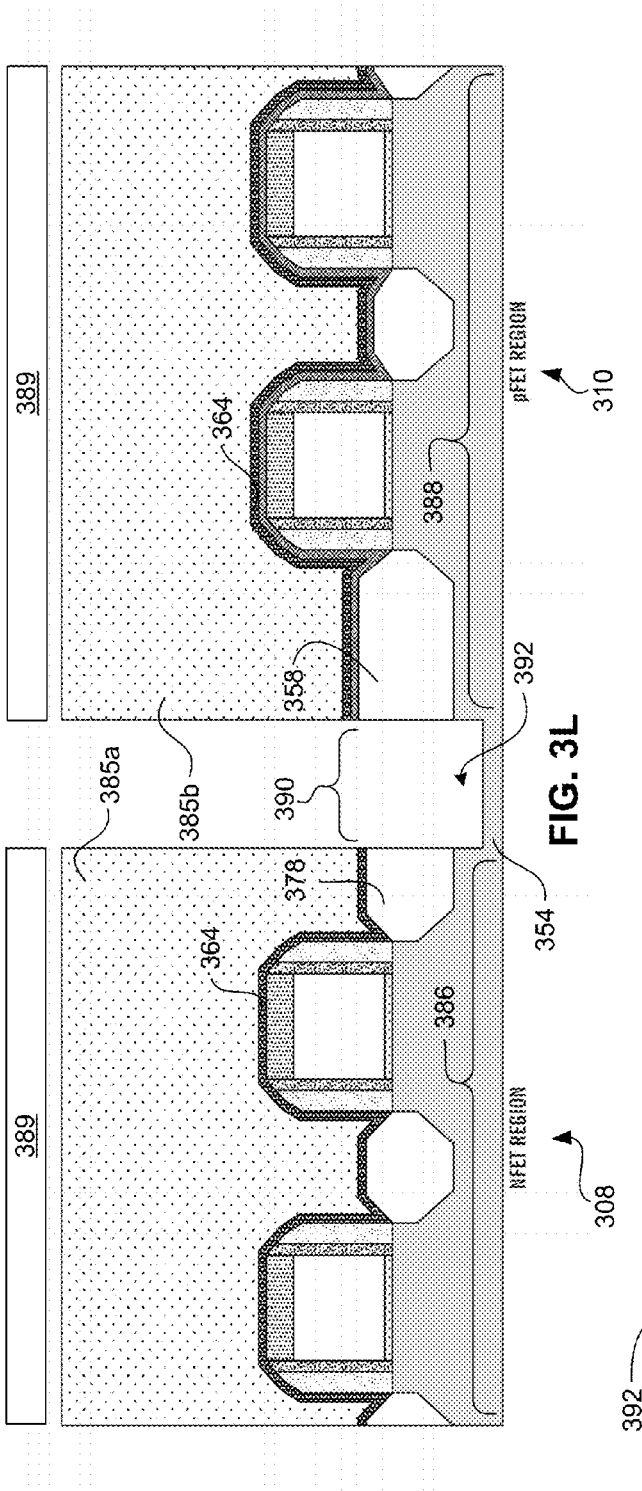

Referring to FIG. 3K, a MOL (Middle Of Line) liner 382 is deposited over the structure of FIG. 2F in order to protect the surfaces of epitaxially grown source/drain regions 358, 360, 376, and 378 during subsequent thermal oxidation steps. Referring to FIG. 3L, another second cut mask 389 is used to pattern a photo resist stack layer in a manner whereby photo resist section 385a covers portion 386 of nFET region 308 and photo resist section 385b covers portion 388 of pFET region 310. Since the open center region of the second cut mask leaves region 390 of the photo resist stack layer exposed, RIE etching may be utilized to etch into, and separate, source/drain regions 378 and 358. Thus, the second cut mask overlaps patterning provided by the first cut mask used in the prior center gate (i.e., dummy date) removal process.

Figure 3M:
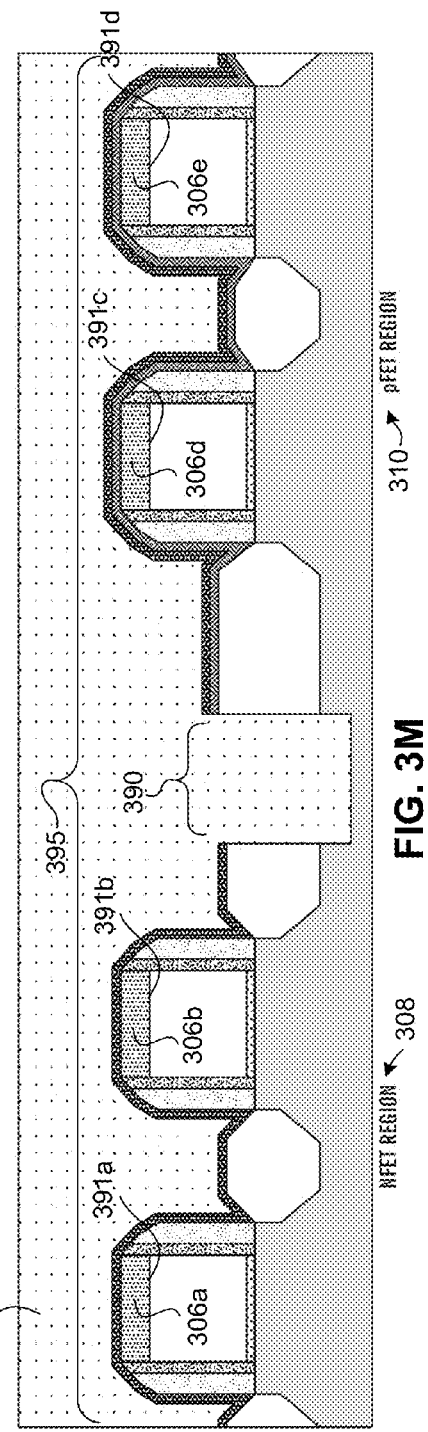

The protective layer 364 within region 390 may be etched using CF containing plasma. The areas of the source/drain regions 378, 358 and a portion 392 of the silicon layer 354 within region 390 may be etched with HBr containing chemistry. Referring to FIGS. 3L and 3M, device isolation between nFET and pFET regions 308 and 310 may, therefore, be achieved by creating opening region 390, and filing opening 390 with MOL insulation material 392. As illustrated in FIG. 3M, the MOL insulation material 392 also covers the entire structure 395 in addition to filing opening 390.

FIG. 3N refers to the resulting structure up to contact formation. Gate electrode and gate dielectrics may be formed through a RMG process. The RMG process may include polishing insulator 392 (FIG. 3M) down to cap nitride surfaces 391a-391d (FIG. 3M) for cap nitride layers 306a, 306b, 306d, and 306e (FIG. 3M), respectively. Cap nitride layers 306a, 306b, 306d, 306e may be further opened by RIE or other appropriate processes. An n-type device and p-type device gate can be opened using a resist mask and processed separately. Once the gate poly regions are exposed and removed, high K material, band gap engineered material, and metal electrode material are filled in opened regions. High K material may include HfO in the range of 0.5-3 nm. Band gap engineering material may contain rare earth elements or any appropriate metal to adjust band gap. The metal electrode may include, among other materials, Aluminum. Contacts 396a-396d may be formed after RMG with insulator deposition, contact lithography, RIE, and contact metal fill process steps. Also, MOL insulation material 397 may be used to fill the created opening region 390 up to surface 398 of the structure in order to electrically isolate source/drain region 378 and contact 396b from source/drain region 358 and contact 396c.

Figure 2J:
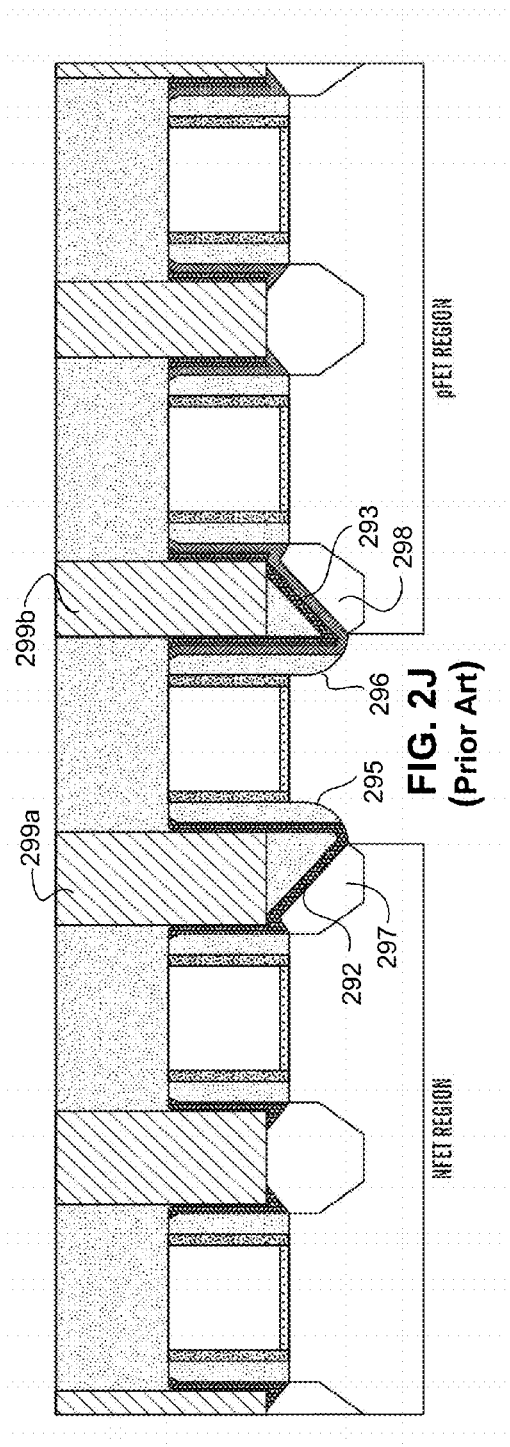
Figure 2K:
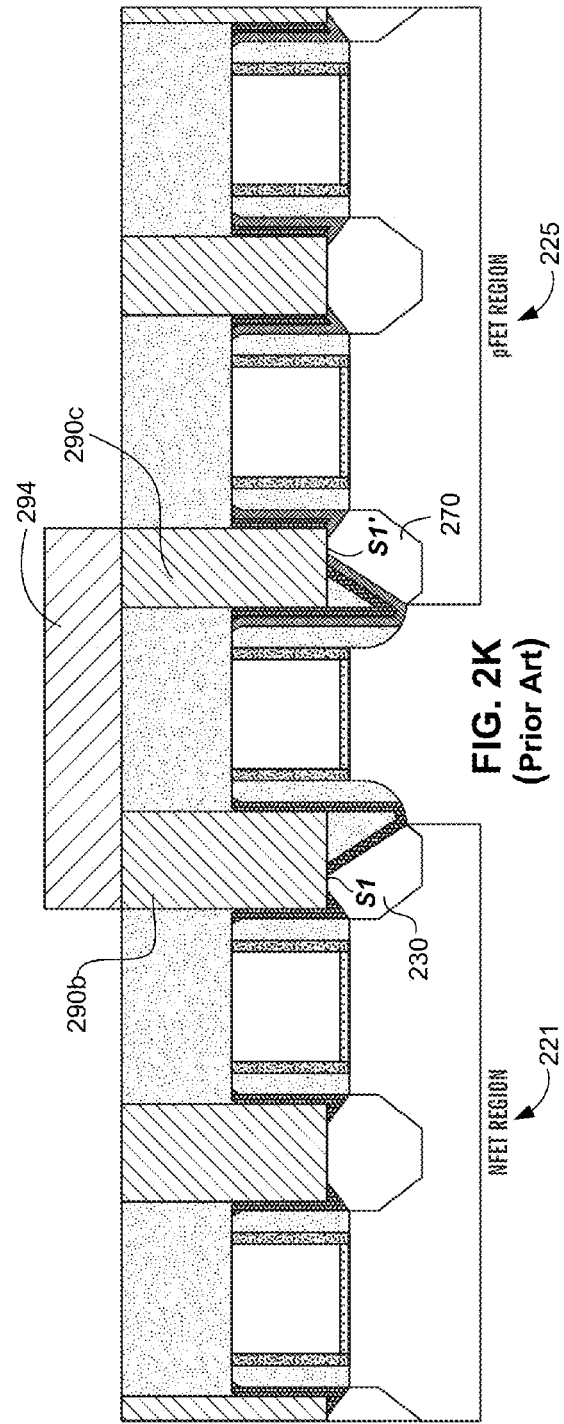

As further illustrated in FIG. 3N, the contacts 396a-396d establish an electrical connection with their respective source/drain regions 376, 378, 358, 360 without the electrical connection drawbacks shown and described above in relation to FIGS. 2I and 2J. As shown, in contrast with the structures depicted in FIGS. 2I and 2J, there is no faceting at the interface region 399a between the isolation region provide by the MOL filled opening 390 and source/drain region 378. Similarly, there is no faceting at interface region 399b between the isolation region and source/drain region 358. Thus, contacts 396b and 396c establish an electrical connection with surfaces S4 and S5 of source/drain regions 378 and 358, respectively, whereby, as illustrated, surfaces S4 and S5 of the grown source/drain regions 378, 358 have sufficient area to accommodate an electrical connection with most, if not all, of the contact area associated with contacts 396b and 396c.

FIG. 3O refers to an embodiment whereby adjacent epitaxially grown source/drain regions of different devices (e.g., nFETs and pFETs) may be electrically connected to form circuits (e.g., an inverters). The structure shown in FIG. 3O may be generated from the structure of FIG. 3K using RMG and contact formation/fill processes. In this embodiment, the processes (i.e., cut mask & MOL insulator fill) associated with FIGS. 3L and 3M are bypassed, and the previously described RMG and contact formation/fill processes are initiated. As illustrated, cap nitride layers 306a, 306b, 306d, 306e (FIG. 3K) may be opened by RIE or another appropriate etch process. An n-type device and p-type device gate may be removed and processed separately using a resist mask to block one type of device while the other type is processed. Once the gate poly regions 393a-393d are exposed and removed, high K material, band gap engineered material, and metal electrode material may be filled in the gate poly regions 393a-393d. High K material may include HfO in the range of 0.5-3.0 nm. Band gap engineering materials may contain rare earth elements or any appropriate metal to adjust band gap. The metal electrode may include, among other materials, Aluminum. Contacts 396a, 396d, and 396e may be formed after RMG with insulator deposition, contact lithography, RIE, and contact metal fill process steps.

As depicted in FIG. 3O, formed contact 396e is a large single contact that connects both source/drain regions 378 and 358. By connecting the source/drain regions 378, 358 according to such processes, a lower contact resistance is achieved in comparison to forming separate contacts for each of the source/drain regions 378, 358 (see FIG. 3N), and subsequently connecting these contacts. For example, in an inverter circuit, the source/drain region 378 of nFET device D1 may be connected to the source/drain region 358 of pFET device D2 using single contact 396e. Accordingly, the contact resistance between the nFET and pFET source/drain regions 378, 358 is reduced in comparison to a configuration where source/drain regions 378, 358 are isolated (e.g., see FIG. 3N) and require a separate connection (not shown) in order to establish electrical connectivity between their contacts (see FIG. 3N).

Figure 4A:
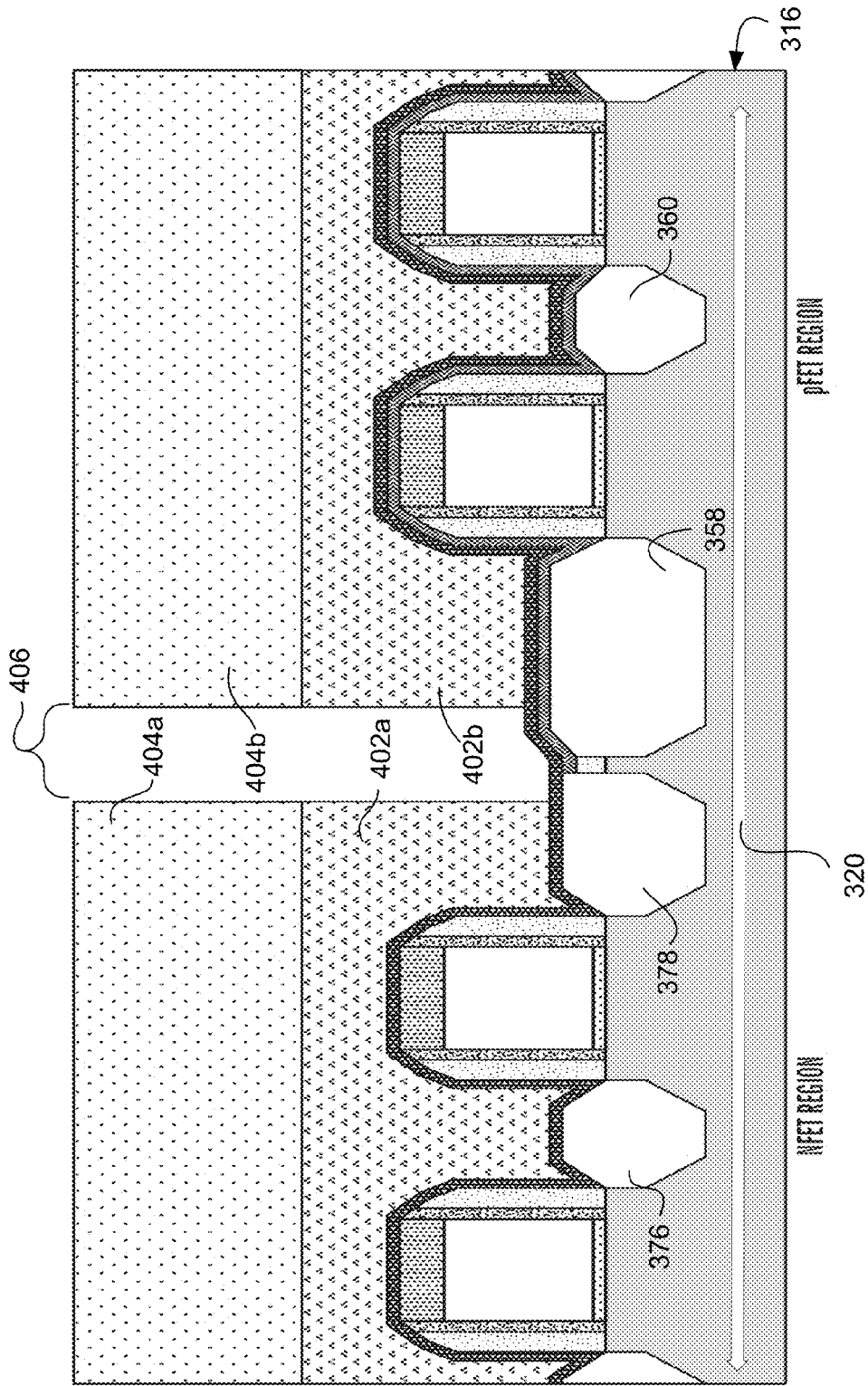
FIGS. 4A-4E are vertical cross-sectional views of a semiconductor structure that illustrate the formation of facet-less epitaxial regions, according to at least one other embodiment.

FIGS. 4A-4E illustrate exemplary semiconductor structures and processes associated with growing facet-less epitaxial regions according to other embodiments. The structure shown in FIG. 4A may be generated from the structure of FIG. 3K, whereby an interlayer dielectric (ILD) material is formed over the entire structure depicted in FIG. 3K. In the embodiment of FIG. 4A, the ILD layer is utilized as a hard mask for subsequent photo lithography and etching processes. As illustrated, using a cut mask, the ILD and photo resist layer are opened up following the epitaxial growth of source/drain regions 376, 378, 358, and 360 on the active region formed on the continuous portion 320 of substrate 316. Thus, the cut mask creates ILD regions 402a and 402b via patterned photo resist layers 404a and 404b. Opening region 406 created by the cut mask, provides access to source/drain regions 378 and 358 for the purpose of either creating an isolation region between the source/drain regions 378, 358 or providing electrical contact between source/drain regions 376, 358.

Figure 4B:
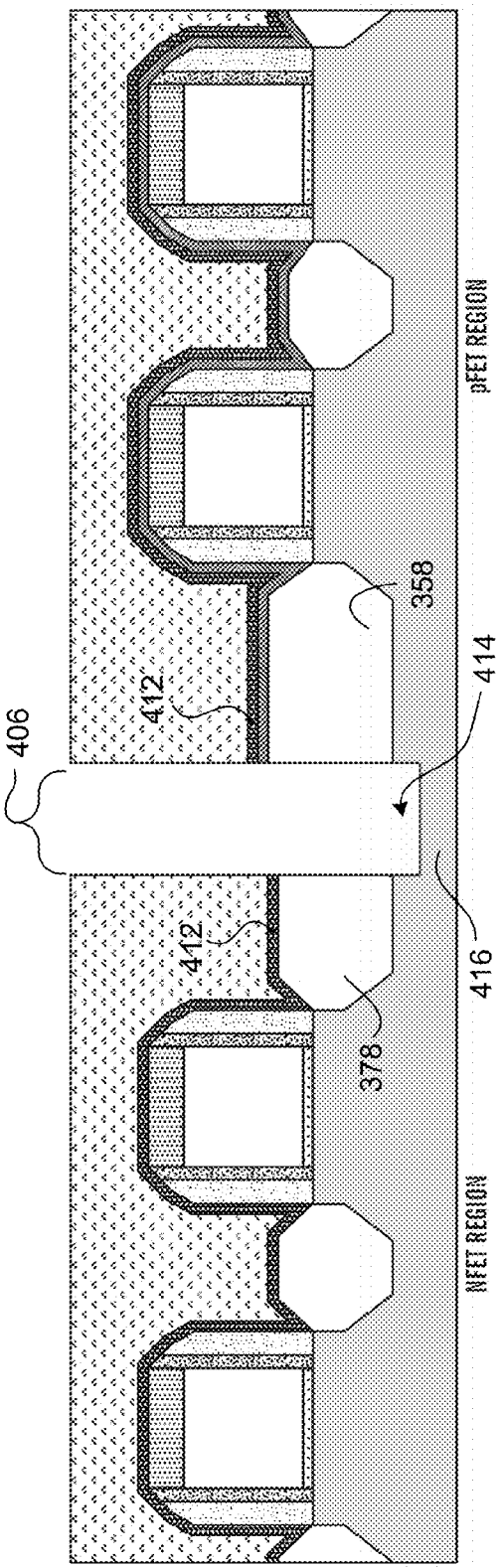

Referring to FIG. 4B, the photo resist layers 404a, 404b (FIG. 4A) are striped. Since the open center region of the cut mask leaves region 406 of the photo resist stack layer exposed, RIE etching may be utilized to etch into, and separate, source/drain regions 378 and 358. The protective layer 412 may be etched from region 406 using CF containing plasma. The areas of the source/drain regions 378, 358 and a portion 414 of the silicon layer 416 within opening 406 may be etched using with HBr containing chemistry.

Figure 4C:
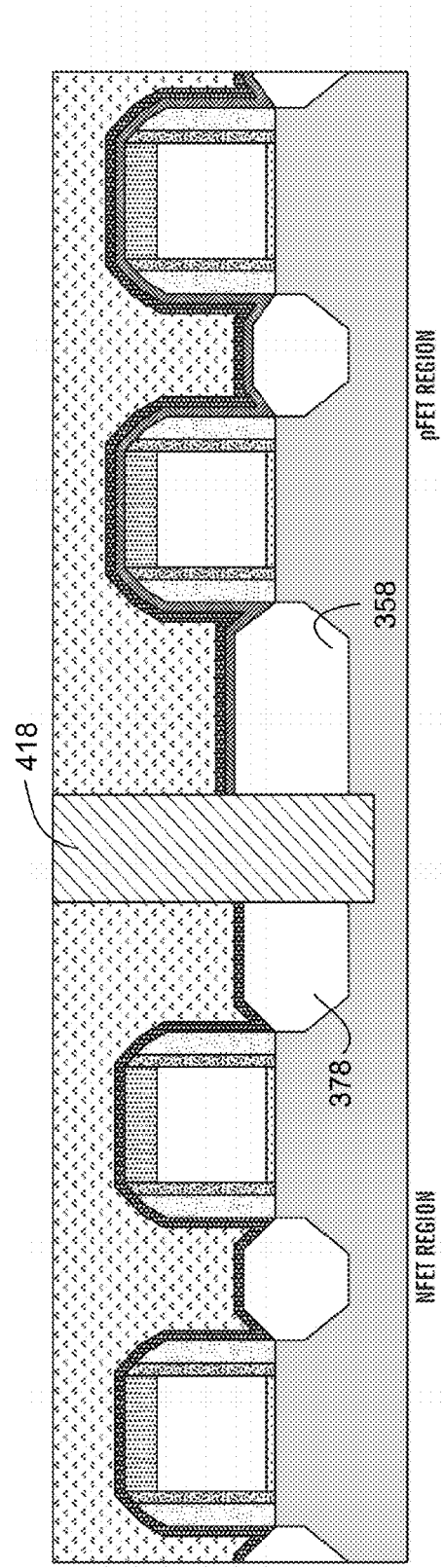

Referring to FIG. 4C, in order to isolate source/drain regions 378 and 358, etched opening region 406 (FIG. 4B) may be filled with insulator material 418. The insulator material 418 can be different than ILD regions 402a and 402b (FIG. 4A) in order to have etch-selectivity (i.e., different etch rates) for the formation of contacts. For example, a silicon nitride insulator material may be used if the ILD regions 402a, 402b (FIG. 4A) are silicon oxide. It may be possible to use a different type of silicon oxide insulator material 418 than the ILD regions 402a, 402b, which have the requisite etch selectivity. The opening 406 in FIG. 4B is near the minimum ground rule and the formation of insulator material 418 can be carried out by either filling and etch back, or via CMP.

Figure 4D:
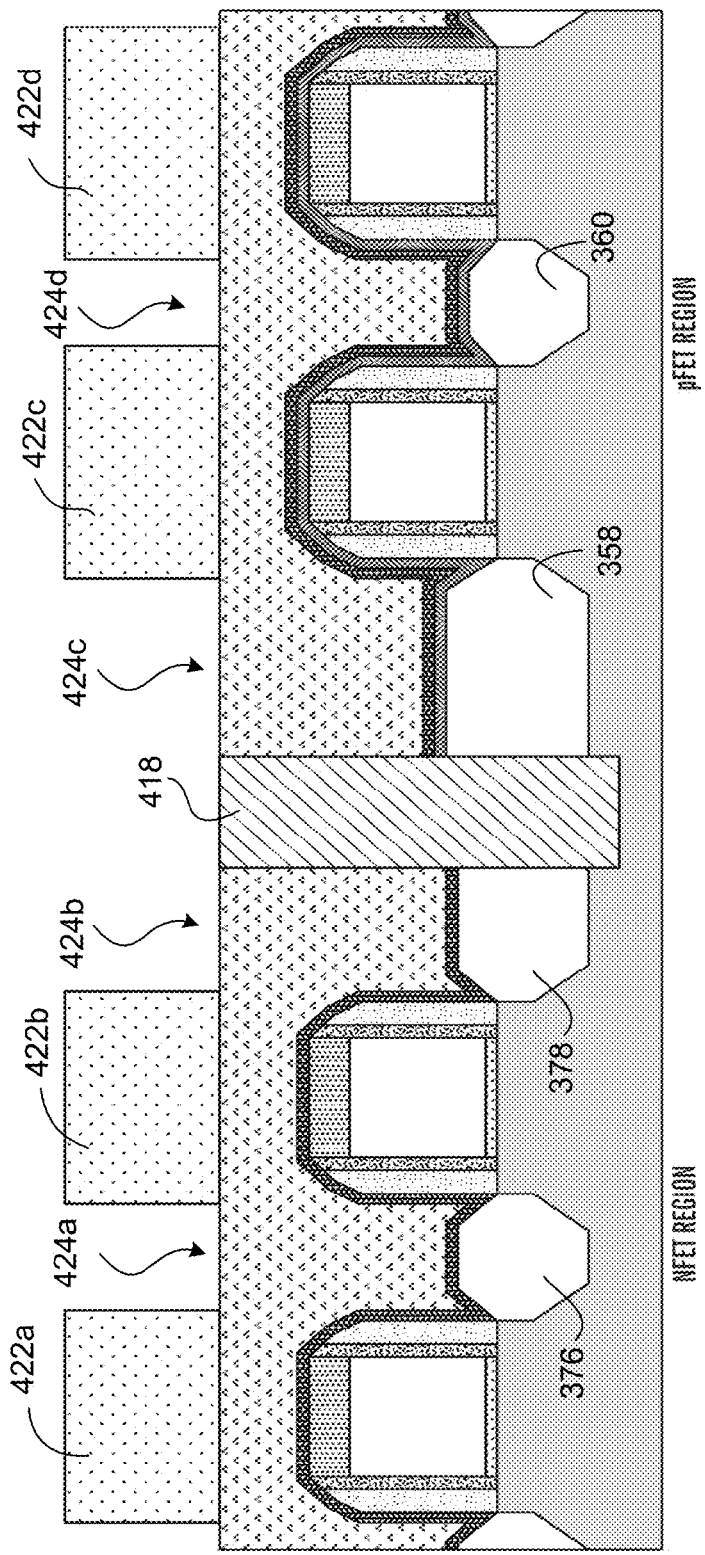
Figure 4E:
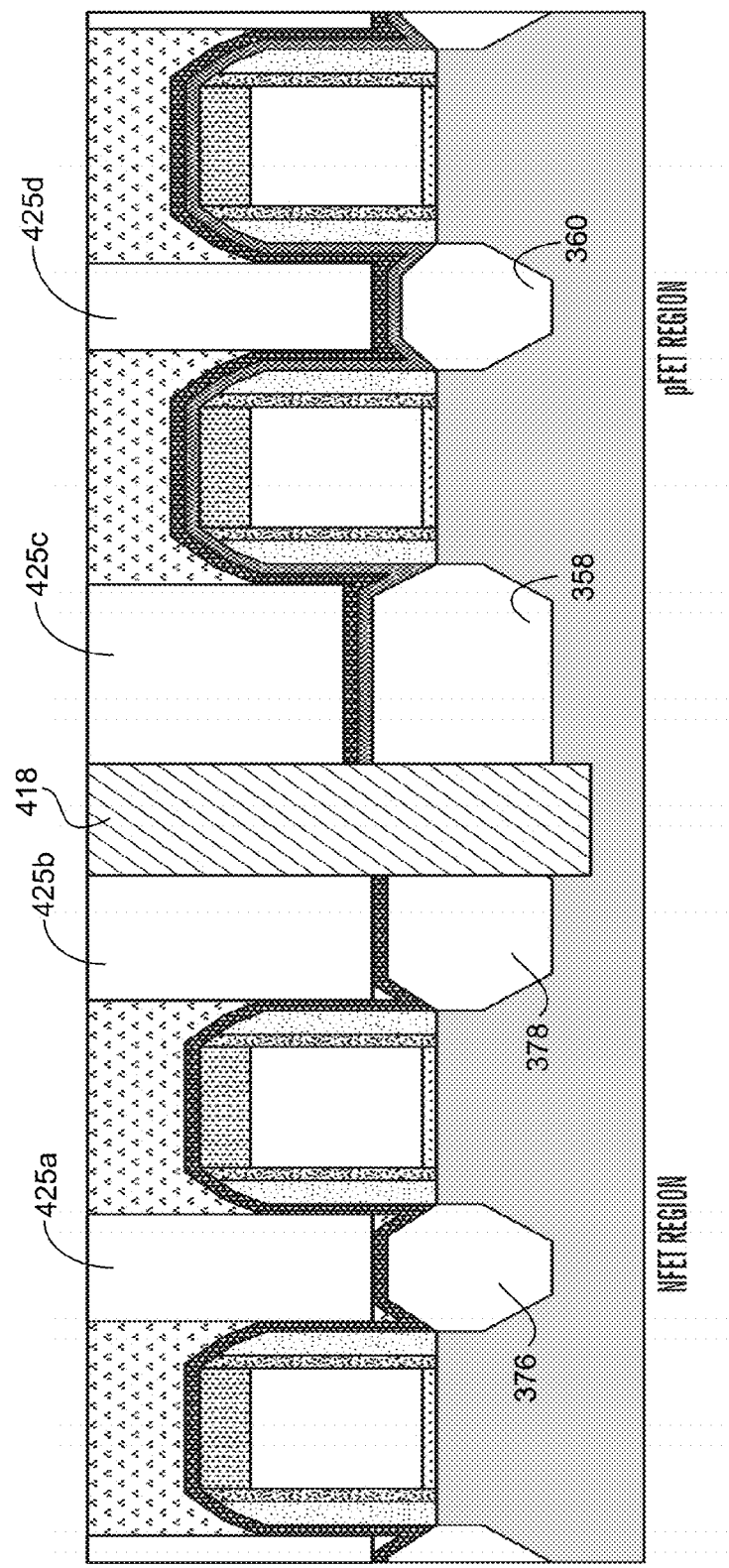

As illustrated in FIG. 4D, patterned photo resist layers 422a-422d are formed for the purpose of subsequent contact creation at source/drain regions 376, 378, 358, and 360. As shown, photo resist is not covered on top of insulator material 418, which acts as a self-aligned mask in subsequent etch steps for creating contacts on either side of the insulator material 418 (FIG. 4E). As illustrated in FIG. 4E, areas 424a-424d (FIG. 4D) not protected by photo resist layers 422a-422d (FIG. 4D), respectively, are etched down to the source/drain regions 376, 378, 358, 360 using an RIE process. The insulator 418 is not etched away and due to etch selectivity difference between insulator 418 and ILD 402a-402b. Etch selectivity may be obtained using typical dry etching methods by adjusting various CF containing gases (e.g., $CF_4$, $CH_3F$, $C_4F_8$) and the flow of other carbon containing gases (CO, $CO_2$), pressure, or power. Thus, self aligned contacts are formed from the cut mask opening 406 (FIG. 4A). The photo resist layers 422a-422c (FIG. 4D) are then striped away. The areas etched (i.e., RIE) down to the source/drain regions 376, 378, 358, 360 may be filled with conductive material (e.g., tungsten or copper) in order to form contacts with the source/drain regions 376, 378, 358, 360. For example, contacts 425a-425d are formed by filling the etched area above source/drain region 376 with an electrically conductive material such as tungsten, copper or aluminum.

Figure 5:
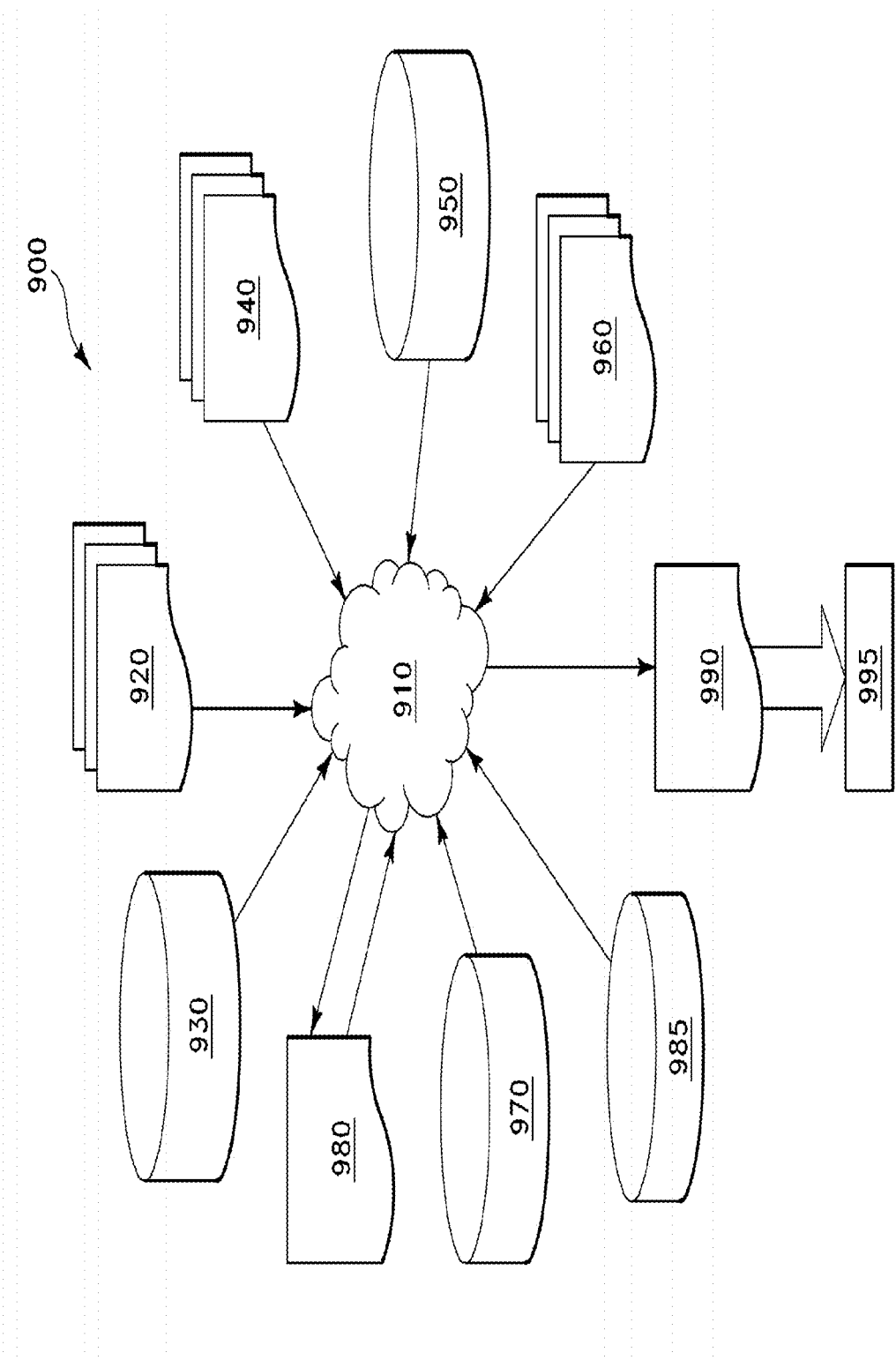
FIG. 5 is a flow diagram of a design process used in semiconductor design, manufacture, and/or test.

FIG. 5 illustrates multiple such design structures including an input design structure 920 that is preferably processed by a design process 910. In one embodiment, the design structure 920 comprises design data used in a design process and comprising information describing an embodiment of the invention with respect to the structures as shown in FIG. 3N or 3O. The design data in the form of schematics or HDL, a hardware-description language (e.g., Verilog, VHDL, C, etc.) may be embodied on one or more machine readable media. For example, design structure 920 may be a text file, numerical data or a graphical representation of an embodiment of the invention, as shown in FIG. 3N or 3O. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIG. 3N or 3O. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 3N or 3O to generate a netlist 980 which may contain a design structure such as design structure 920. Netlist 980 may comprise, for example, compiled or otherwise processed data structures representing a list of wires, discrete components, logic gates, control circuits, 110 devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 3N or 3O. In one embodiment, design structure 990 may comprise a compiled, executable HDL simulation model that functionally simulates the device shown in FIG. 3N or 3O.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 3N or 3O. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure on a substrate, the method comprising:
   preparing a continuous active layer on a region of the substrate;
   depositing a first raised epitaxial layer on a first region of the continuous active layer;
   depositing a second raised epitaxial layer on a second region of the continuous active layer, wherein the first raised epitaxial layer is in close proximity to the second raised epitaxial layer;
   forming, prior to the depositing of the first and the second raised epitaxial layer, transistor gate structures associated with the first raised epitaxial layer and the second raised epitaxial layer on the continuous active layer;
   etching, using a first cut mask, a dummy gate region associated with the formed transistor gate structures prior to the depositing of the first and the second raised epitaxial layer on a continuous active region within the continuous active layer;
   etching, using a second cut mask, a trench structure into the continuous active layer at both the first and the second raised epitaxial layer; and
   filling the trench structure with isolation material, the isolation material electrically isolating the first raised epitaxial layer from the second raised epitaxial layer.

2. The method of claim 1, wherein the second cut mask overlaps the etched dummy gate region provided by the first cut mask.

3. The method of claim 1, wherein depositing the first raised epitaxial layer comprises depositing a first raised source/drain layer of a first transistor.

4. The method of claim 3, wherein depositing the second raised epitaxial layer comprises depositing a second raised source/drain layer of a second transistor next to said first transistor.

5. The method of claim 1, wherein filling the trench structure with isolation material comprises filling the trench structure with high density plasma (HDP) oxide.

6. The method of claim 1, wherein depositing the first raised epitaxial layer on a first region of the continuous active layer comprises forming a first facet-less raised epitaxial layer of a first transistor, wherein the first facet-less raised epitaxial layer is facet-less at a first edge of the trench structure filled with isolation material.

7. The method of claim 6, wherein depositing the second raised epitaxial layer on a second region of the continuous active layer comprises forming a second facet-less raised epitaxial layer of a second transistor, wherein the second facet-less raised epitaxial layer is facet-less at a second edge of the trench structure filled with isolation material, the first and the second transistor being adjacent.

8. The method of claim 1, further comprising:
   covering, prior to the etching using the second cut mask, the deposited first and the deposited second raised epitaxial layer with an interlayer dielectric (ILD) layer of insulation material under the second cut mask; and
   opening, using the second cut mask, the trench structure in the interlayer dielectric (ILD) layer of insulation material above the deposited first and the deposited second raised epitaxial layer.

9. The method of claim 8, wherein:
   depositing the first raised epitaxial layer on a first region of the continuous active layer comprises depositing a first facet-less raised epitaxial layer of a first transistor, wherein the first facet-less raised epitaxial layer is facet-less at a first edge of the trench structure filled with isolation material; and
   depositing the second raised epitaxial layer on a second region of the continuous active layer comprises depositing a second facet-less raised epitaxial layer of a second transistor, wherein the second facet-less raised epitaxial layer is facet-less at a second edge of the trench structure filled with isolation material, the first and the second transistor being adjacent.

10. The method of claim 8, further comprising, prior to the depositing of the first and the second raised epitaxial layer:
    forming transistor gate structures associated with the first raised epitaxial layer and the second raised epitaxial layer on the continuous active layer; and
    etching, using the first cut mask, a dummy transistor gate associated with the formed transistor gate structures.

11. The method of claim 8, wherein depositing the first raised epitaxial layer comprises depositing a first raised source/drain layer of a first transistor.

12. The method of claim 11, wherein depositing the second raised epitaxial layer comprises depositing a second raised source/drain layer of a second transistor.

13. The method of claim 8, wherein filling the trench structure with isolation material comprises filling the trench structure with a silicon oxide insulator material.

14. The method of claim 8, wherein the isolation material is different than the interlayer dielectric (ILD) material, and wherein the isolation material has a different etch-rate from that of the interlayer dielectric material (ILD).

15. A method of forming a semiconductor structure on a substrate, the method comprising:
    preparing a continuous active layer on a region of the substrate;
    depositing a first raised epitaxial layer on a first region of the continuous active layer, wherein the first raised epitaxial layer corresponds to a first device;
    depositing a second raised epitaxial layer on a second region of the continuous active layer, the second raised epitaxial layer corresponding to a second device, wherein the first raised epitaxial layer is in close proximity to the second raised epitaxial layer;
    forming, prior to the depositing of the first and the second raised epitaxial layer, transistor gate structures associated with the first raised epitaxial layer and the second raised epitaxial layer on the continuous active layer;
    etching, using a first cut mask, a dummy gate region associated with the formed transistor gate structures prior to the depositing of the first and the second raised epitaxial layer on a continuous active region within the continuous active layer; and electrically connecting the first raised epitaxial layer and the second raised epitaxial layer for connecting the first and the second device.

* * * * *